(12) United States Patent  (10) Patent No.: US 8,309,838 B2
Chen  (45) Date of Patent: Nov. 13, 2012

(54) POTENTIAL AMPLIFIED NONEQUILIBRIUM THERMAL ELECTRIC DEVICE (PANTEC)

(75) Inventor: Gang Chen, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1446 days.

(21) Appl. No.: 11/035,479

(22) Filed: Jan. 14, 2005

(65) Prior Publication Data
US 2005/0155642 A1  Jul. 21, 2005

Related U.S. Application Data

(60) Provisional application No. 60/536,907, filed on Jan. 16, 2004.

(51) Int. Cl.
*H01L 31/00* (2006.01)
*H01L 35/28* (2006.01)

(52) U.S. Cl. ........ 136/201; 136/205; 136/204; 136/203; 62/3.2; 62/3.3; 257/930; 257/470; 257/467; 257/712; 257/93

(58) Field of Classification Search .................. 136/205, 136/201, 204, 203; 62/3.2, 3.3; 257/930, 257/470, 467, 712, 93
See application file for complete search history.

(56) References Cited

U.S. PATENT DOCUMENTS

| | | | | |
|---|---|---|---|---|
| 3,564,860 A | * | 2/1971 | Reich et al. | 62/3.7 |
| 3,873,370 A | * | 3/1975 | Hampl et al. | 136/205 |
| 5,006,178 A | * | 4/1991 | Bijvoets | 136/211 |
| 5,722,242 A | * | 3/1998 | Edelson | 62/3.1 |
| 5,817,188 A | * | 10/1998 | Yahatz et al. | 136/237 |
| 5,955,772 A | | 9/1999 | Shakouri et al. | |
| 6,060,331 A | | 5/2000 | Shakouri et al. | |
| 6,323,414 B1 | | 11/2001 | Shakouri et al. | |

(Continued)

FOREIGN PATENT DOCUMENTS
WO  WO 00/33354 A3  6/2000

OTHER PUBLICATIONS

Pipe, K.P. et al., "Bias-Dependent Peltier Coefficient and Internal Cooling in Bipolar Devices", The American Physical Society, Physical Review B 125316, Sep. 27, 2002, 11 pages.

(Continued)

*Primary Examiner* — Jonathan Johnson
*Assistant Examiner* — Golam Mowla
(74) *Attorney, Agent, or Firm* — Daly, Crowley, Mofford & Durkee, LLP

(57) ABSTRACT

A semiconductor structure is provided that can be used for cooling, heating, and power generation. A first region of the semiconductor structure has a first length and comprises a first semiconductor material doped at a first concentration with a first dopant. A second region is disposed adjacent to the first region so as to define a first interface, has a second length which is longer than the first length, and comprises a second semiconductor material doped at a second concentration with a second dopant. At least one of the first material, second material, first concentration, second concentration, first length, second length, first dopant, and second dopant is selected to create, at the first interface, a forward electrical potential step having a barrier height dependent at least in part on an average temperature (T) of the semiconductor structure, e.g., a range of approximately 3-10 $\kappa_B T$, where $\kappa_B$ is the Boltzmann constant.

34 Claims, 18 Drawing Sheets

U.S. PATENT DOCUMENTS

| | | | |
|---|---|---|---|
| 6,396,191 | B1 | 5/2002 | Hagelstein et al. |
| 6,403,874 | B1 | 6/2002 | Shakouri et al. |
| 6,686,532 | B1 * | 2/2004 | Macris .................... 136/204 |
| 6,779,347 | B2 | 8/2004 | Kucherov et al. |
| 6,800,933 | B1 * | 10/2004 | Mathews et al. ............. 257/712 |
| 2002/0014261 | A1 * | 2/2002 | Caillat et al. ................. 136/205 |
| 2002/0033188 | A1 | 3/2002 | Shakouri et al. |
| 2002/0189661 | A1 * | 12/2002 | Caillat et al. ............... 136/236.1 |
| 2003/0033818 | A1 | 2/2003 | Kucherov et al. |

OTHER PUBLICATIONS

Mahan, G.D., et al., "Multilayer Thermionic Refridgeration", The American Physical Society, Physical Review Letters, vol. 80, No. 18, May 4, 1998, 4 pages.

Hagelstein, P.L. et al., "Enhanced Figure of Merit in Thermal to Electrical Energy Conversion using Diode Structures", American Institute of Physics, Applied Physics Letters, vol. 81, No. 3, Jul. 15, 2002, 3 pages.

Kucherov, Yan et al., "Study of Emitter Structures for InSb Thermal Diodes", 22nd International Conference of Thermoelectrics, 2003, 4 pages.

Chen, Gang, "Potential-step Amplified Nonequilibrium Thermalelectric Converters", American Institute of Physics, Journal of Applied Physics 97, 1, Jan. 18, 2005, 8 pages.

Zeng, Taofang, et al., "hot Electron Effects on Thermionic Emission Cooling in Heterostructures", Proceedings of MRS Fall Meeting, vol. 545, Dec. 30, 2004, pp. 467-472.

Chen, Gang, "Nonequilibrium Electron-Phonon Thermionic Power Generators", Proposal Submitted in Response to BAA 03-02, vol. 1, Jan. 15, 2004, 30 pages.

Chen, Gang, "Nonequilibrium Electron-Phonon Transport Near Sharp Potential Steps", Massachusetts Institute of Technology, Presentation given at ICT04, Adelaide, Jul. 27, 2004, 22 pages.

PCT Search Report and Written Opinion of the ISA for PCT/US/2005/001422 dated Sep. 13, 2005.

Chen, G. et al.; "Thermally-Excited Nonequilibrium States Between Electrons and Phonons for Energy Converions;" MECT2004, Aug. 8-13, 2004; XP-0022222341888; retrieved from the internet on Aug. 15, 2005: <URL:http://mect-04.snu.ac.kr/down/keynote03.pdf>.

Hagelstein, P. et al.; "Thermally-Induced Current Injection Across an npn Structure;" 22nd International Conference on Thermoelectrics (2003); Aug. 17-21, 2003; IEEE Aug. 17, 2003; XP-10697374A; pp. 554-557.

Hagelstein, P. et al.; "Thermally-Induced Current Injection Across an n*-n Junction;" 21st Int'l. Conference on Thermoelectrics (2002); Aug. 25-29, 2002; XP-10637577A; pp. 400-403.

Kucherov, Y. et al; "Energy Conversion Using Diode-like Structures;" 21st Int'l. Conference on Thermoelectrics, (2002); Aug. 25-29, 2002; XP-10637518A; pp. 431-434.

Mahan, G.D. et al.; "Multilayer Thermionic Refrigeration;" Physical Review Letters, 1998 The American Physical Society; vol. 80, No. 18; May 4, 1998; XP-000956428; pp. 4016-4019.

Pipe, K.P. et al; "Bias-Dependent Peltier Coefficient and Internal Cooling in Bipolar Devices;" 2002 The American Physical Society; Physical Review B, 125316 (2002); APS through AIP, vol. 66. No. 12; Sep. 15, 2002; XP-002341889; pp. 125316.1-125316.11.

Zeng, Taofang et al.; "Hot Electron Effects on Thermionic Emission Cooling in Heterostructures;" Mat. Res. Soc. Symp.Proc., vol. 545, 1999 Materials Research Society; XP008051576; pp. 201-206 pp. 467-472.

Zeng, T. et al.; "Nonequilibrium Electron and Phonon Transport and Energy Conversion in Heterostructures;" Microelectronics Journal 34 (2003); retrieved from the internet at <doi:10.1016/X0026-2692(02)00189-1; pp. 201-206.

* cited by examiner (D)

(G)

POTENTIAL AMPLIFIED NONEQUILIBRIUM THERMAL ELECTRIC DEVICE (PANTEC)

CROSS-REFERENCE TO RELATED APPLICATIONS

This application claims the benefit of U.S. Provisional Application Ser. No. 60/536,907 entitled COLD ELECTRON THERMAL ELECTRIC DIODE filed Jan. 16, 2004, the contents of which are incorporated herein by reference in their entirety.

STATEMENT REGARDING FEDERALLY SPONSORED RESEARCH

Not Applicable

FIELD OF THE INVENTION

Embodiments of the invention generally relate to electronic devices and, more specifically, to thermoelectric devices.

BACKGROUND OF THE INVENTION

Direct thermal to electric power generation and refrigeration technologies, based on thermoelectric effects, are attractive for use in a wide range of applications because of their reliability, quiet operation, reduced complexity, reduced maintenance cost, and power scalability (e.g., from milliwatts to kilowatts and, potentially, to megawatts). Direct energy conversion between heat and electricity using thermoelectric effects for power generation, refrigeration, and heat pumping has been studied extensively. For example, devices such as thermoelectric (TE) coolers have been used for the cooling of semiconductor lasers, in compact refrigerators, and in analytical equipment. TE coolers can have limited efficiency, however, because of the limitations of the materials used in their fabrication. Thermoelectric power generators have been used to provide power in space missions and for terrestrial applications in remote areas.

The efficiency of thermoelectric devices, such as coolers and/or power generators, is determined at least in part by the material's figure of merit, $Z=S^2\sigma/k$, where S is the Seebeck coefficient, $\sigma$ the electrical conductivity, and k the thermal conductivity. Many known power generators, made of state-of-the art commercial materials, have relatively low efficiency, limiting them to only a few niche applications. Most of the efforts in thermoelectrics research have been in developing new materials, such as nanostructured materials. Significant progress has been made in recent years in materials research, leading to increases in the figure-of-merit. In addition to materials research, different device configurations have been explored with the hope of improving the energy conversion efficiency. Past studies have included the investigation of thermoelectric effects in pn junctions and minority carrier effects, thermionic refrigeration, and power generation based on single and multilayer structures.

Theoretical studies have shown that neither minority carrier nor thermionic emission-based devices can lead to thermal-electric energy conversion efficiency higher than that of pure thermoelectric devices. It has also been stated that the built-in potential of semiconductor structures does not have any effect on thermoelectric transport. Some recent experimental data, however, suggests that certain semiconductor diode structures can lead to increased output voltage and efficiency. Some researchers have recognized that the nonequilibrium between electrons and phonons can potentially be exploited to increase energy conversion efficiency. There have been few, if any, proposals to use novel device structures to improve efficiency, and the success of the few device structures that have been proposed has been quite limited.

SUMMARY OF THE INVENTION

The nonequilibrium between electrons and phonons can potentially be exploited to increase energy conversion efficiency. In one aspect, this invention proposes that the existence of a new thermal-electric behavior near a sharp potential step can be exploited to build refrigeration, heat pump, and power generation devices with improved efficiency over conventional thermoelectric devices. This effect can also be used to improve the performance of semiconductor lasers and detectors. It is known that an equivalent Seebeck coefficient exists at an electrostatic potential interface. However, the interface temperature discontinuity is usually very small, and the corresponding thermoelectric voltage generated due to this interface Seebeck coefficient is small. In at least some embodiments, this invention illustrates that, with a properly designed device structure, a large electron temperature drop can occur near the interface, creating highly nonequilibrium states between electrons and phonons. This invention terms such device structures "Potential-Step Amplified Nonequilibrium Thermal-Electric Converters", or PANTECs. More reasons for this name are explained later herein.

In one embodiment, a semiconductor structure is provided. The semiconductor structure comprises first and second regions. The first region has a first length and comprises a first semiconductor material doped at a first concentration with a first dopant. The second region is disposed adjacent to the first region so as to define a first interface, the second region having a second length which is longer than the first length and comprising a second semiconductor material doped at a second concentration with a second dopant. At least one of the first material, second material, first concentration, second concentration, first length, second length, first dopant, and second dopant is selected such that a forward electrical potential step is created at the first interface, the forward potential step having a barrier height dependent at least in part on an average temperature (T) of the semiconductor structure. For example, the barrier height can have a range of approximately $3\text{-}10\,\kappa_B T$, where $\kappa_B$ is the Boltzmann constant and T is the average temperature of the semiconductor structure.

At least one of the first material, second material, first concentration, second concentration, first length, second length, first dopant, and second dopant can be selected such that the barrier height has a range of approximately $3\text{-}10\,\kappa_B T$, where $\kappa_B$ is the Boltzmann constant and T is the average temperature of the semiconductor structure. The forward electrical potential step can have a width smaller than the electron mean free path across the first interface. At least one of the first and second dopants can have a profile optimized for current injection across the first interface. The second length can be selected such that the second region is doped more heavily than the first region. The first and second materials can be associated with respective first and second electrical resistances, wherein the first and second lengths are selected such that the second resistance is large enough (e.g., ten times as great), compared to the first resistance, to generate a temperature difference between a first electron temperature in the first region and a second electron temperature at the interface.

At least one of the first and second semiconductor materials can comprise a material having an electron-phonon coupling factor less than about $10^{12}$ W/m³K. At least one of the first and second semiconductor materials can comprise at least one of Mercury Cadmium Telluride (HgCdTe), cadmium arsenide ($Cd_3As_2$), $CaSnAs_2$, Cadmium Sulfide (CdS), Cadmium Selenium (CdSe), and Mercury Selenide (HgSe), Germanium (Ge) and SiGe alloy, Gallium Arsenide (GaAs) and its alloys, Bismuth Telluride ($Bi_2Te_3$), $Bi_2Se_3$, $Sb_2Te_3$, and their alloys, Gallium Phosphide (GaP), Indium Arsenide (InAs), Indium Antimonide (InSb), Indium Phosphide (InP), Lead Telluride (PbTe), Lead Selenide (PbSe), SnSe and their alloys.

In a further embodiment, the invention provides a method for providing a first semiconductor structure for use in thermoelectric applications, the method comprising the unordered steps of:

(a) providing a first region of a first semiconductor material, the first region having a first size and the first semiconductor material being doped to a first concentration with a first dopant;

(b) providing a second region of a second semiconductor material, the second region having a second size and the second semiconductor material being doped to a second concentration with a second dopant;

(c) arranging the first and second regions to be adjacent to each other so as to define a first interface therebetween; and (d) selecting at least one of the first material, second material, first concentration, second concentration, first size, second size, first dopant, and second dopant such that a forward electrical potential step is created at the first interface.

In another embodiment, steps (a) through (d) are repeated to form a second semiconductor structure, which is coupled to the first semiconductor structure.

In further embodiments, the above method can include selecting at least one of the first material, second material, first concentration, second concentration, first size, second size, first dopant, and second dopant such that the barrier height of the forward electrical potential step has a range of approximately 3-10 $\kappa_B T$, where $\kappa_B$ is the Boltzmann constant and T is the average temperature of the first semiconductor structure. The above method can also include constructing and arranging the first and second regions such that the second region is doped more heavily than the first region.

In still another embodiment, the invention provides a method of changing the temperature of an object or area, comprising:

providing a potential amplified nonequilibrium thermal electric device (PANTEC), the PANTEC having first and second sides;

disposing the first side of the PANTEC substantially adjacent to at least one of a first object or area, the first object or area being an object or area whose temperature is to be changed;

disposing the second side of the PANTEC substantially adjacent to at least one of a second object or area, the second object or area constructed and arranged to receive at least one of heat or cold;

applying a current such that at least one of electrons and holes leave the first side of the PANTEC if the first object or area is to be cooled; and applying a current such that at least one of electrons and holes flow towards the side of PANTEC where the first object or area is to be heated.

Providing a PANTEC, in one embodiment, comprises providing a semiconductor structure having a first region disposed adjacent to the first side of the PANTEC and a second region disposed adjacent to the second side of the PANTEC, wherein the first region has a first length and comprises a first semiconductor material doped at a first concentration with a first dopant and the second region is disposed adjacent to the first region so as to define a first interface, wherein the second region has a second length longer than the first length and comprises a second semiconductor material doped at a second concentration with a second dopant, and wherein at least one of the first material, second material, first concentration, second concentration, first length, second length, first dopant, and second dopant is selected such that a forward electrical potential step is created at the first interface, the forward potential step having a barrier height dependent at least in part on an average temperature (T) of the semiconductor structure. Providing a PANTEC can also comprise providing a stack comprising at least two PANTECs coupled together.

As another example, in one embodiment, the invention provides a method of generating power, comprising:

providing a potential amplified nonequilibrium thermal electric device (PANTEC), the PANTEC having first and second sides;

disposing the first side of the PANTEC substantially adjacent to a heat source; and disposing the second side of the PANTEC such that it is in communication with an object or area capable of operating as a heat sink.

Providing a PANTEC can further comprise providing a plurality of PANTECs, such as a plurality of PANTECs connected together electrically in series and thermally in parallel. The plurality of PANTECs can comprise all n-types, all p-types, or a mix thereof.

In at least some embodiments, the semiconductor structure can operate as a potential amplified nonequilibrium thermal electric device (PANTEC) and can be used for cooling, heating and power generation for a wide variety of devices. In further embodiments, the semiconductor structure can also be combined directly into the design of semiconductor devices such as lasers, detectors, and microelectronic devices.

Details relating to this and other embodiments of the invention are described more fully herein.

BRIEF DESCRIPTION OF THE DRAWINGS

The advantages and aspects of the present invention will be more fully understood in conjunction with the following detailed description and accompanying drawings, wherein.

The drawings are not to scale, emphasis instead being placed on illustrating the principles of the invention. In the drawings, like reference numbers indicate like elements.

DETAILED DESCRIPTION

Before describing the figures, some introductory concepts are explained. It has, in accordance with the present invention, been discovered that the existence of a large thermoelectric effect at properly designed electrical potential steps can be exploited to provide devices for use in thermoelectric coolers and power generators. A large non-equilibrium between electrons and phonons can be created at a potential step either by a heat flux (for power generation) or an electrical current. In at least some embodiments of the invention, it has been found that this effect exists only in a so-called forward structural configuration. A forward structural configuration is provided by a semiconductor structure having first region with low doping and a second region with high doping, and which has a length that is long compared to the length of the first region. The first and second regions are coupled at an interface, and a potential step exists from the short to the long region. Similar forward structures can also be created by joining two different materials (heterointerfaces), or by using different dopant types. When a heat flux is applied across the device, this potential step amplifies the electron temperature drop, leading to a large discontinuity in the electron temperature at the interface. This electron temperature discontinuity leads to a large Fermi level discontinuity, which increases the effective Seebeck voltage (S) of the semiconductor structure. The power factor $S^2\sigma$, where $\sigma$ is the electrical conductivity, is thus increased significantly over the best thermoelectric materials reachable from either the short, low doped region or the long, highly doped region. A thermoelectric effect similar to this does not exist in a reverse structure. Modeling carried out by the inventor, as further described herein, has shown that increases in thermal-electric power generation and cooling efficiency can be realized in devices that apply and use the above-described thermoelectric effect.

Structures having this novel thermoelectric effect can be applied to build refrigeration, heat pumping, and power generation devices with improved efficiency over conventional thermoelectric devices. This thermoelectric effect can also be used to improve the performance of semiconductor lasers and detectors by incorporating similar structures directly into these devices. With the properly designed semiconductor device structures described in the embodiments herein, a large electron temperature drop occurs near the interface, creating highly nonequilibrium states between electrons and phonons. Semiconductor device structures that are provided having the above-described characteristic are sometimes referred to herein as potential-step amplified nonequilibrium thermal-electric converters, or PANTECs.

Figure 1:
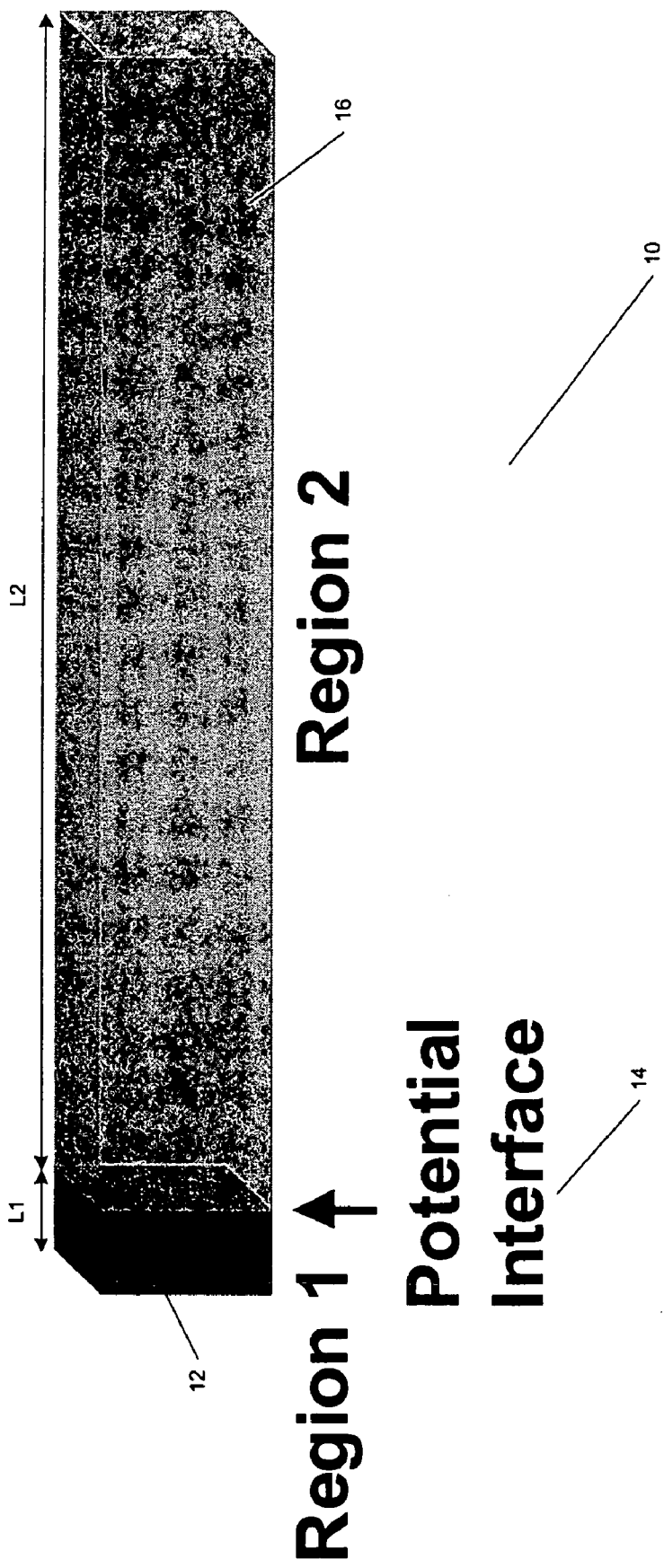
FIG. 1 is an illustration of a semiconductor structure having region lengths and doping characteristics selected to provide a desired potential at an interface.

Referring now to FIG. 1, a semiconductor structure 10 includes a first region 12 provided from a first semiconductor material and having a first length L1 and a second region 16 provided from a second semiconductor material and having a second length L2. The second region 16 is disposed adjacent to the first region 12 so as to define a first interface 14. The first semiconductor material is doped at a first dopant concentration with a first dopant and has electrons at a first electron temperature. The second region is formed from a second semiconductor material doped at a second concentration with a second dopant and has electrons at a second electron temperature (at equilibrium, the electron temperatures will be substantially the same). It will be appreciated that FIG. 1 is not intended to be a literal illustration of the semiconductor structure 10, but rather is provided to aid in describing the concepts claimed herein.

As FIG. 1 illustrates, the second region 16 is relatively long compared with the length of the first region 12. Having L2 longer than L1 ensures that the thermal resistance of the second region 16 is greater than the thermal resistance of the first region 12. This is important because L2 region serves as the "puller" for creating the electron temperature discontinuity at the interface. In one embodiment, the second length L2 is at least 10 times as long as the first length L1, but it should be understood that this ratio is not limiting. In addition, the second dopant concentration preferably is greater than the first dopant concentration (that is, the second region 16 is more heavily doped than the first region 12).

Figure 2:
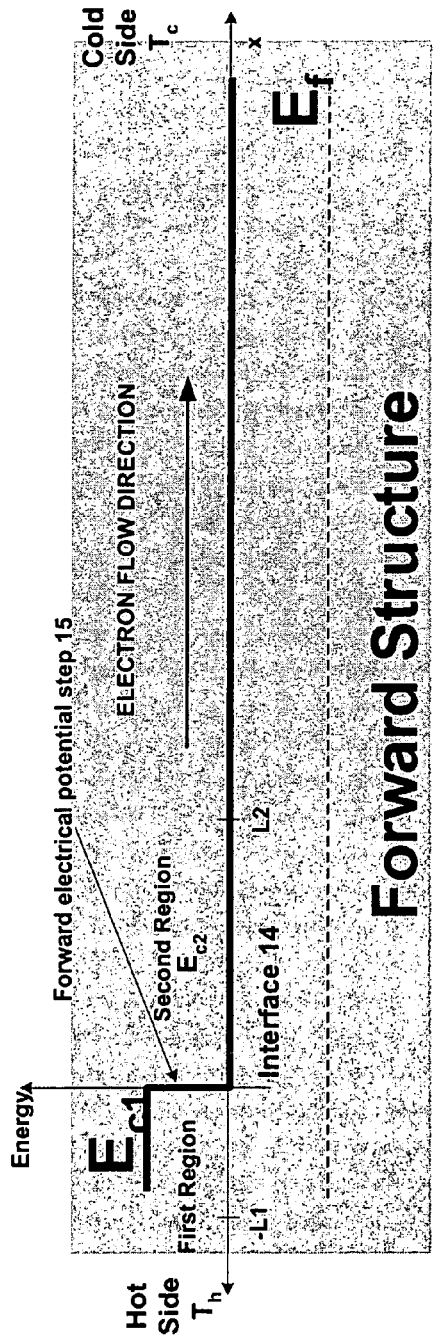
FIG. 2A is a graph showing desired potential profile as a function of distance across one embodiment of the device, for the semiconductor structure of FIG. 1, in the case where an external temperature difference is applied so as to create heat flux flowing along the positive x-direction in the semiconductor structure.
FIG. 2B is a graph showing another potential as a function of distance for the semiconductor structure of FIG. 1, in the case where an external temperature difference is applied so as to create heat flux flowing along the negative x-direction in the semiconductor structure.
FIG. 2C is a graph showing another potential profile as a function of distance across one embodiment of the device of FIG. 1.
FIG. 2D is a graph showing a potential profile for the device of FIG. 1 where the second region is a p-type region.
Figure 2:
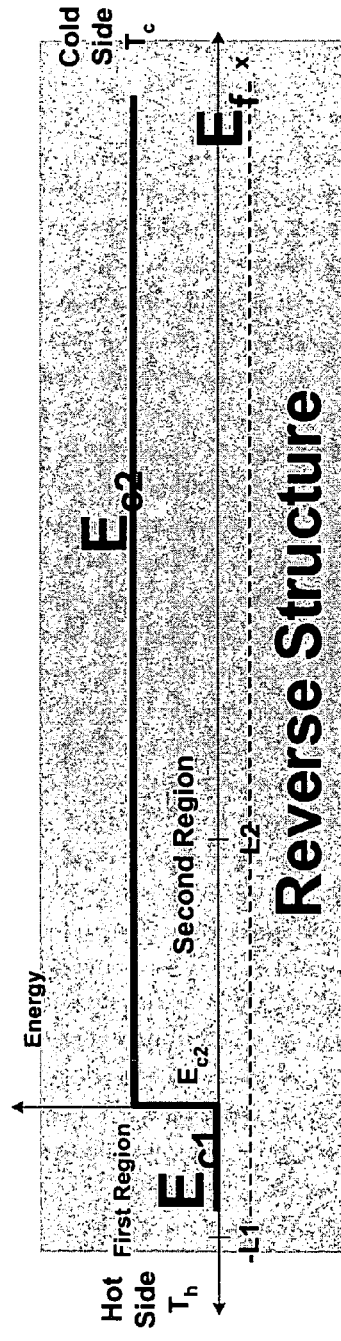
Figure 2:
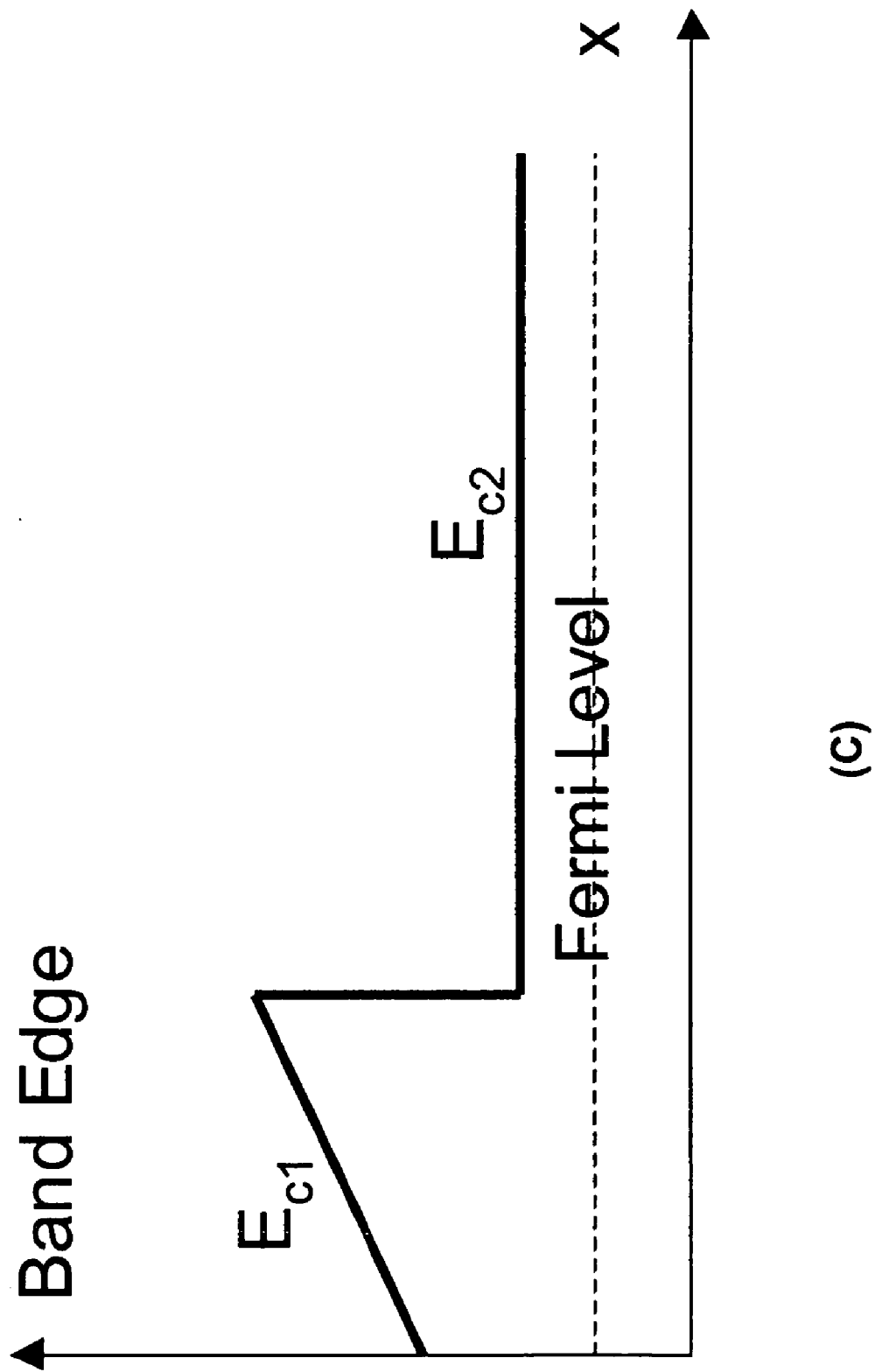
Figure 2:
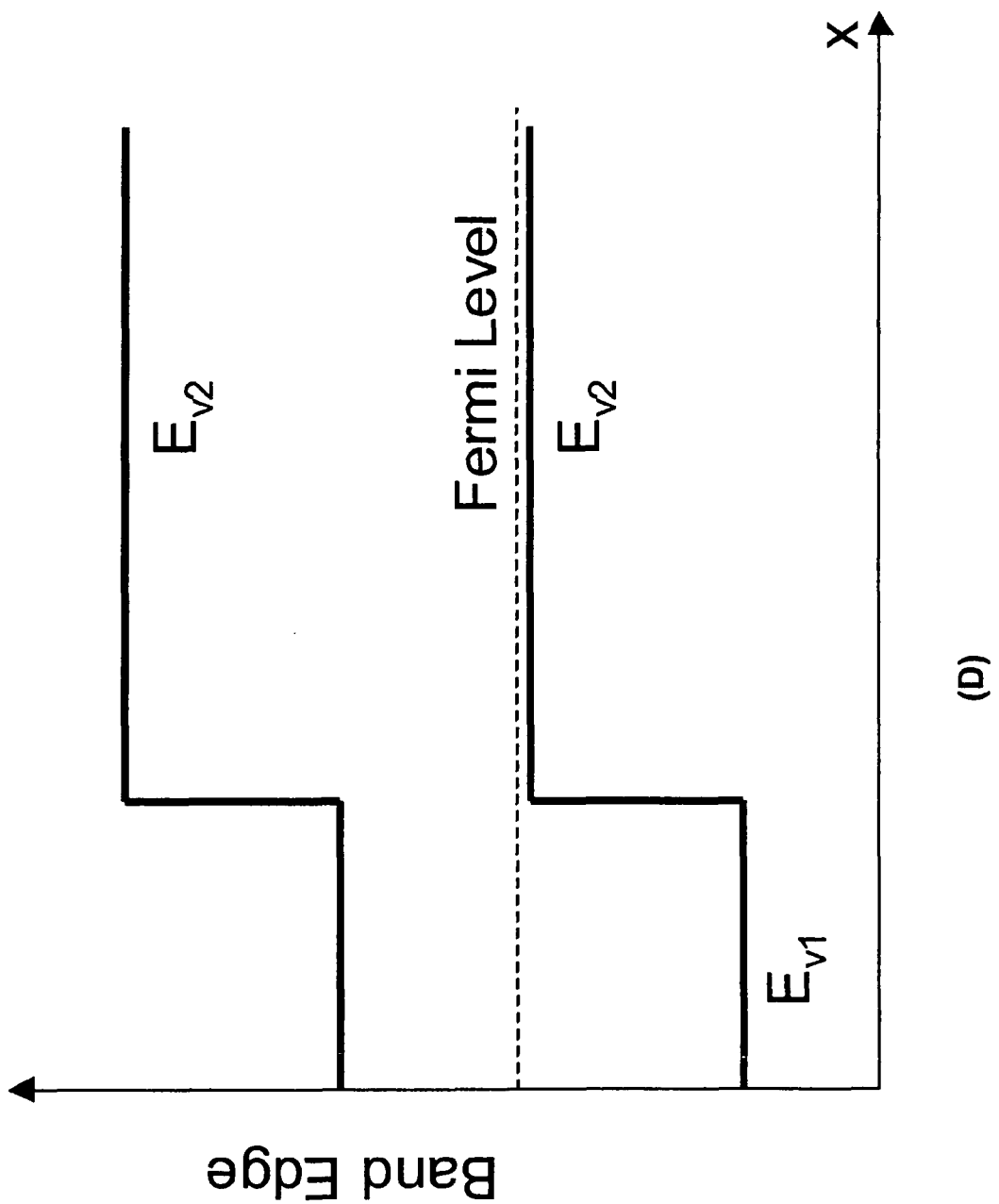

The first and second materials can be the same type of material (irrespective of the doping) (that is, the semiconductor structure 10 can be provided as a homojunction) or can be different types of material (that is, the semiconductor structure 10 can be provided as a heterojunction). As those skilled in the art will appreciate, a wide range of parameters can be considered in selecting the first and second materials, including, but not limited to:

(a) the materials properties (e.g., dopant concentration, dopant type (e.g., p-type, n-type), dopant distribution (the dopant does not have to be constant in each region; advantageously, graded doping can be provided in one or both of the regions, as described further herein in connection with FIG. 2C), mobility, electrical and thermal conductivity, barrier height, band structure, and electron-phonon coupling factor; and (b) the device structures: the length of first and second regions, the interface sharpness, and the contact region.

Dopant types and/or distributions can be selected to have a profile wherein current injection is optimized across the interface 14. The sizes and/or thicknesses of the first region 12 and the second region 16 can be selected such that the second region 16 is more heavily doped than the first region 12. In addition, in one embodiment, at least one of the first material, second material, first concentration, second concentration, first length, second length, first dopant, and second dopant is selected such that a forward electrical potential step is created at the first interface, the forward potential step having a barrier height dependent at least in part on an average temperature (T) of the semiconductor structure. For example, the barrier height can have a range of approximately 3-10 $\kappa_B T$, where $\kappa_B$ is the Boltzmann constant and T is the average temperature of the semiconductor structure 10.

A parameter that is very important is the electron-phonon coupling factor G, which depends at least in part upon the scattering mechanisms (optical and acoustic phonon scattering, polar and nonpolar materials). Electron-phonon coupling of materials can be measured or estimated, and the accuracy of G estimation can be improved based upon existing theories on electron-phonon interactions and upon experimental determination.

Preferably at least one of the semiconductor regions 12, 16, particularly region 16, comprises a material having an electron-phonon coupling factor less than about $10^{12}$ W/m³K (watts per cubic meter per degree Kelvin). These materials are likely to be found in semiconductors with high mobilities. Examples of materials that are usable in at least some embodiments of the invention include (but are not limited to) Mercury Cadmium Telluride (HgCdTe), cadmium arsenide ($Cd_3As_2$), $CaSnAs_2$, Cadmium Sulfide (CdS), Cadmium Selenium (CdSe), and Mercury Selenide (HgSe), Germanium (Ge) and SiGe alloy, Gallium Arsenide (GaAs) and its alloys, Bismuth Telluride ($Bi_2Te_3$), $Bi_2Se_3$, $Sb_2Te_3$, and their alloys, Gallium Phosphide (GaP), Indium Arsenide (InAs), Indium Antimonide (InSb), Indium Phosphide (InP), Lead Telluride (PbTe), Lead Selenide (PbSe), SnSe and their alloys.

In addition to the materials, the device geometry of the semiconductor structure 10 is also very important. The electron temperature drop at the interface 14 depends on the electron temperature gradient, which itself depends on the relative lengths L1, L2 of the first and second regions 12, 16, respectively, as well as the materials properties and the dopant concentration in each region.

For at least some embodiments of the invention, the first and second region dopant concentrations, first and second materials, first and second dopants, and/or the first and second lengths L1, L2 are selected such that a forward electrical potential step is created at the interface 14. When at least one of the following conditions occurs: an external temperature difference is applied to the device, or a current is passed through the device, the potential step creates a large electron temperature discontinuity (e.g., electron temperature drop for power generation or electron temperature rise for cooling) between the first and second region electron temperatures.

In contrast, in a typical homogeneous semiconductor device, the electron temperature drop over one electron mean free path is very small.

With the semiconductor structure 10 of FIG. 1, however, the potential step acts to amplify the electron temperature discontinuity across the interface, due to the carrier density difference contributing to the drift-diffusion current on the lower potential side (second region 16) and the thermionic current from the higher potential side (first region 12). The electron temperature drop across the interface leads to a large Seebeck voltage change at the interface (for power generation) and increases the efficiency of power generation. The high electron temperature when an external current passes through the device increases the efficiency of cooling.

FIG. 2A is a graph showing one embodiment of a desirable potential profile as a function of distance across the semiconductor structure 10 for cooling and power generation. As indicated by reference number 15 in FIG. 2A, the forward electrical potential step 15 is substantially sharp. In one embodiment, a "sharp" forward electrical potential step means that the electrical potential step 15 has a width smaller than the electron mean free path across the first interface. That is, the region where the potential is changing (i.e., the "potential change region," such as the slope of the step 15 in FIG. 2A) is small enough or narrow enough to ensure that electrons are ballistically transported through the first interface. Ballistic transport of electrons, as those skilled in the art appreciate, generally describes motion of electrons in ultra-small (e.g., highly confined) regions in semiconductor structures. Ballistic electrons are subject to little or no scattering.

An important discovery for implementing the invention is that, near a potential step, electrons and phonons can be pushed far out of equilibrium with each other. This leads to a large electron temperature discontinuity and a large equivalent Seebeck voltage (not just the Seebeck coefficient) when the device is subject to a proper temperature difference or an electrical current. The following is a brief explanation about how this effect arises.

Referring to FIGS. 1 and 2A, consider a sharp potential step, e.g., step 15 as shown in FIG. 2A, assuming, as shown in FIG. 1, that the first region 12 (i.e., L1) is short and the second region 16 (i.e., L2) is long. A temperature difference is applied, as shown in FIG. 2A, by applying or coupling a heat source to one side of the first region and a device, object, or area (e.g., air or water) capable of absorbing heat, such as a heat sink, to one side of the second region.

It can be demonstrated that a large electron temperature discontinuity can be generated for the forward structure of FIG. 2A, under the condition that L2 is much greater than L1 (i.e., L1<<L2). As mentioned previously, this latter condition ensures that the electrical resistance of the second region 16 is much higher than that of the first region 12. Further, as long as the carrier mean free path is longer than the space charge region, the potential at the interface 14 will be sharp.

A large electron temperature discontinuity cannot be generated, however, for the reverse structure of FIG. 2B. (The major difference between 2A and 2B is that in 2B, region 1 has a lower potential than region 2). In this the example of FIG. 2B, the reverse structure does not work, even under the condition that the first region 14 is much shorter than the second region 16.

In at least some embodiments of the invention, the first and second materials are associated with respective first and second electrical resistances, wherein the first and second lengths are selected such that the second resistance is large enough, compared to the first resistance, to generate a temperature difference between the first electron temperature and the second electron temperature. For example, the electrical resistance of the second region 16 is greater than the electrical resistance of the first region 12. As another example, in one embodiment, the electrical resistance of the second region 16 is at least 10 times as great as the first electrical resistance. One reason that it is advantageous for the electrical resistance of the second region 16 to be greater than the electrical resistance of the first region 12 is because this helps to prevent generation of heat in the first region 12. Because the first region 12 is shorter than the second region 16, if the resistance of the first region 12 were large, its heat generation density would be much larger than the heat generation density of the second region 16.

Another aspect of the semiconductor structure 10 that can be controlled is the doping profile in the first region 12 and/or second region 16. The doping profiles in each region need not be linear or constant, as shown in FIG. 2A. For example, FIG. 2C is a graph showing a potential profile as a function of distance across one embodiment of the device of FIG. 1. In FIG. 2C, the doping in the first region 12 has been controlled for easier current injection. This is illustrated in the graph of FIG. 2C by the sloped "ramp" labeled as $E_{c1}$. This ramp reduces the electrical resistance along the length L1 of the first region 12.

The above discussions of the semiconductor structure 10 have assumed that the first and second regions 12, 16 are n-type materials, with electrons dominant in transport across the first interface 14. However, the semiconductor structure 10 can also be designed such that the second region 16 is a p-type region, where holes are dominant in transport across the first interface 14. For example, FIG. 2D is a graph showing a potential profile for the device of FIG. 1 where the second region is a p-type region. It can be seen in FIG. 2D that the Fermi level is close to that of the valence band.

Figure 3:
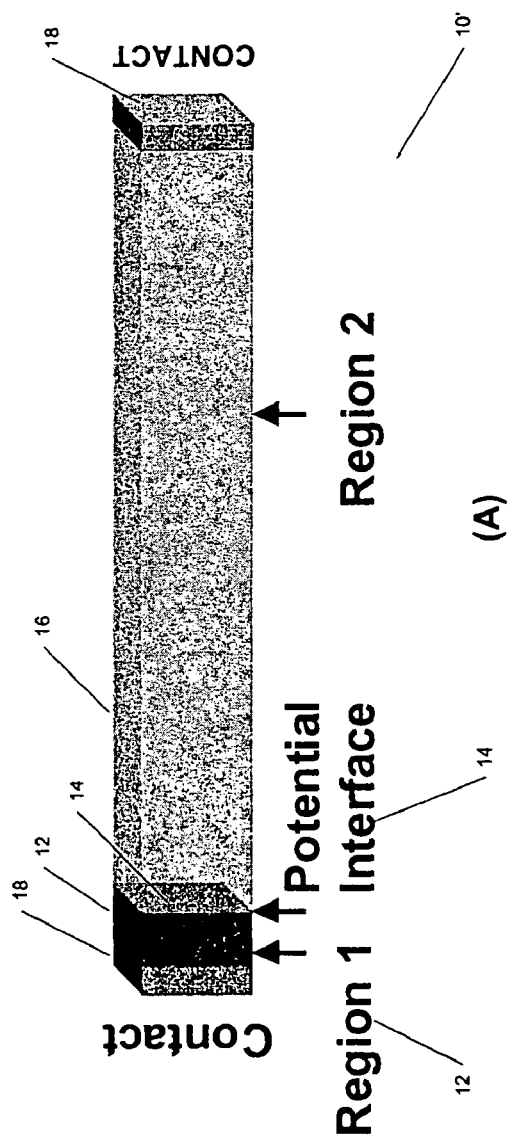
FIG. 3A is an illustration of a semiconductor structure with one electrode attached to the short region.
FIG. 3B is an illustration showing a stack of the semiconductor structures of FIG. 1.
FIG. 3C is a cross-sectional illustration of a semiconductor structure where the heavily doped region serves as a substrate for the lightly doped region and where the lightly doped region is deposited on the heavily doped region.
FIG. 3D is a cross-sectional illustration of a semiconductor structure where the heavily doped region serves as a substrate for the highly doped region and where the lightly doped region is formed from the heavily doped region.
FIG. 3E is a cross-sectional illustration of a semiconductor structure mounted to a substrate.
FIG. 3F is a cross-sectional illustration showing a stacked semiconductor structure mounted to a substrate.
FIG. 3G is a graph showing an illustrative example of a conduction band profile for a stacked semiconductor structure.
Figure 3:
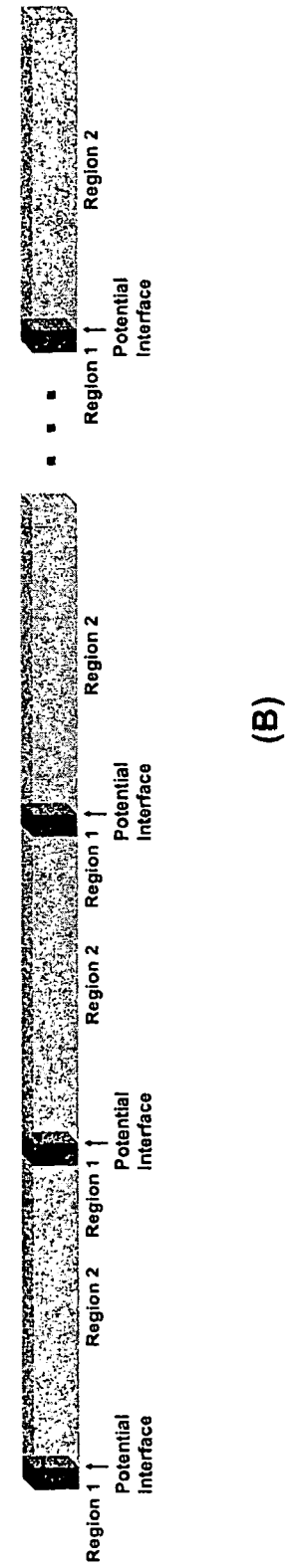
Figure 3:
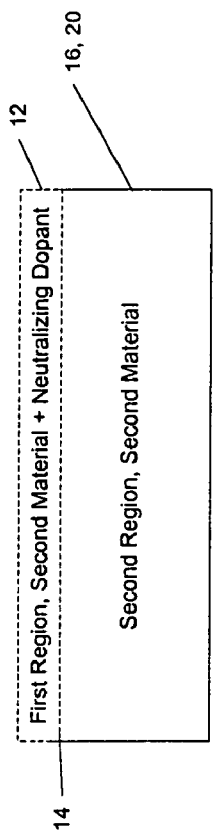
Figure 3:
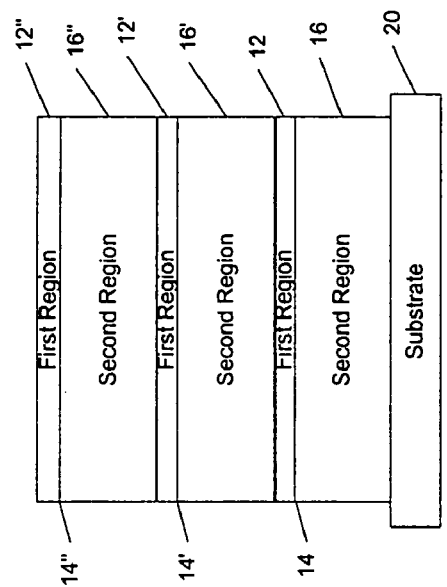
Figure 3:
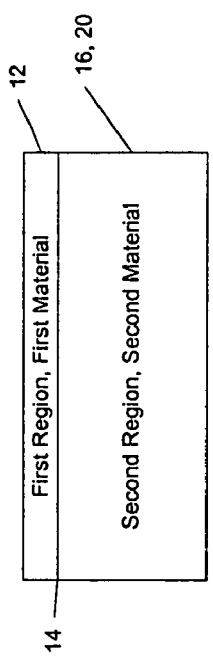
Figure 3:
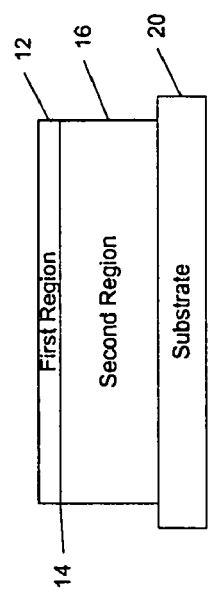
Figure 3:
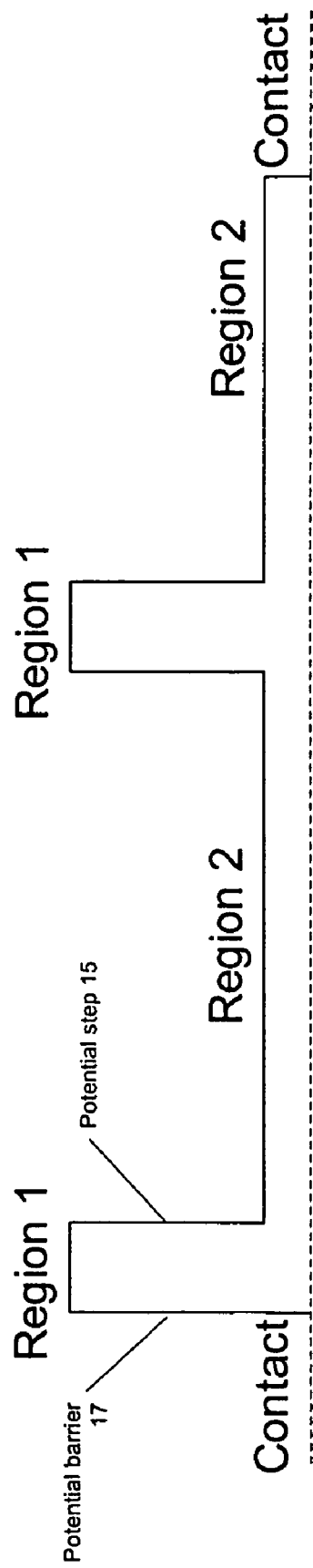

Other device configurations, in accordance with the invention, can also be developed based on the basic principles described herein. For example, FIG. 3A is an illustration of a semiconductor structure that includes a contact 18 (such as an electrode) coupled near the first region 12 (although not illustrated in FIG. 3A, a contact 18 should be coupled to the right side of the second region 16, in accordance with one embodiment of the invention. FIG. 3B is an illustration showing a stack of the semiconductor structures of FIG. 1, in accordance with an embodiment of the invention. FIG. 3C is a cross-sectional illustration of a semiconductor structure where the heavily doped second region 16 also serves as a substrate 10 for the lightly doped first region 12 and where the lightly doped region is deposited on the heavily doped region, in accordance with another embodiment of the invention. FIG. 3D is a cross-sectional illustration of a semiconductor structure where the heavily doped region serves as a substrate for the highly doped region and where the lightly doped region is formed from the heavily doped region. FIG. 3E is a cross-sectional illustration of a semiconductor structure mounted to a substrate 20, in accordance with still another embodiment of the invention. FIG. 3F is a cross-sectional illustration showing a stacked semiconductor structure device mounted to a substrate 20, in accordance with a further embodiment of the invention.

As FIG. 3B and 3F illustrate, two or more semiconductor structures can be stacked side by side or on top of each other, to create a semiconductor structure having significant cooling or power generating capability. In the stack of FIG. 3F, if the stack were to be used for cooling, for example, a current applied would traverse each interface 14, 14', 14". Similarly, if the stack of FIG. 3F were to be used for power generation, a temperature difference could be applied across the entire stack. A contact layer 18 can be coupled to each end of the stack. Alternately, a contact layer can be provided for each semiconductor structure 10 in the stack, for each interface 14, etc. FIG. 3G is a graph showing an illustrative example of a conduction band profile for the stacked structure of FIG. 3B (not exactly, as 3B has 3 interface regions while 3G has only 2). As FIG. 3G illustrates, in the first region, there is both a forward electrical potential step 15 along the interface between the first region and the second region and a potential barrier 17 between the contact and the first region. As FIG. 3G also illustrates, the conducting band edge in the first region, near the interface between the first and second regions, is higher than the conducting band edge in the second region.

In another embodiment, each semiconductor structure 10 in the stack of FIG. 3F (and/or each first region 12 and/or second region 16) can be tailored to provide optimal performance based on the expected temperature at each semiconductor structure 10 and/or region 12, 16. Thus, for example, performance can be optimized by varying least one of the first material, second material, first concentration, second concentration, first length, second length, first dopant, and second dopant, barrier height, etc.

As those skilled in the art will appreciate, the semiconductor structures can be stacked in various ways, in accordance with the invention. For example, the devices in a stack need not all have the same cross section. As a further example of this, in one embodiment, a stack can be constructed where the "topmost" semiconductor structure is smaller, the next one down is larger, the next one down is smaller or larger than the one above it, etc., such that each device can be of a different cross section. For this example, each semiconductor structure in the stack is powered individually and can have a different current (that is, the same current does not go through all semiconductor structures in the stack).

The semiconductor structure 10 of FIG. 1 (including the embodiments illustrated in FIGS. 3A-3F) can be manufactured using virtually any known semiconductor manufacturing technique, and it is anticipated that manufacturing techniques and methods developed in the future will be applicable for manufacture of all or part of the semiconductor structure 10. For example, the semiconductor structure 10 can be manufactured with an external substrate 20 (see FIGS. 3E-3F) that acts as a support structure for the first and second regions 12, 16. A second region 16 can be grown onto the substrate 20, e.g., via deposition, such as physical vapor deposition (PVD), chemical vapor deposition (CVD), liquid phase epitaxy (which can be advantageous if the region being deposited is relatively "thick"), or other known methods. A dopant (i.e., a second dopant) can be incorporated during growth; alternately, the second region 16 can be first grown without dopant and then implanted with the desired dopants. The first region 12 can be grown on top of the second region 16 via similar or different methods to those used for growing the second region 16 and, and a dopant (i.e., a first dopant) can be incorporated or implanted via a variety of methods.

In still another embodiment, the semiconductor structure 10 can manufactured without a separate substrate, as shown in FIGS. 3C and 3D. For example, the second region 16 can serve as both the substrate (support) and as a second region 16, then the first region 12 can be made by growing a thin layer on top of the second region 16, or by any other method described above.

The first and second regions 12, 16 can comprise the same material or different materials. In one embodiment, as shown in FIG. 3D, the first region 12 can actually be formed from a portion of the second region 16. For example, a second region 16, which is to serve as both support and as a heavily doped region, can be grown and doped (note that the second region 16 is typically more heavily doped than the first region 12). A lightly doped first region 12 (illustrated by the dotted lines in FIG. 3D) can be made by implanting a neutralizing dopant to a portion of the second region 16 (e.g., a portion of the second region 16 near its so-called surface region (e.g., the top surface of the second region 16)). The neutralizing dopant reduces the dopant concentration in the portion of the second region 16 to which it is applied.

As part of or after the manufacturing process, one or more contacts 18 (see FIG. 2A) can be provided for the semiconductor structure 10. For example, as FIG. 3A illustrates, a contact 18 can be provided adjacent to each of the first region 12 and the second region 16. The contact 18 can, for example, be an electrode and can be formed from an electrically conductive material.

To see in further detail how the nonequilibrium behavior described herein arises, consider the charge and energy balance across the interface 14. For example, consider the case where the potential step height (FIG. 2A) is larger than $k_B T_e$, where $k_B$ is the Boltzmann constant and $T_e$ with the subscript "e" represents the electron temperature, such that it is sufficient to consider only the $0^{th}$ order in the electron distribution function, i.e., the so-called Bethe criteria in thermionic emission theory.

First, referring to FIGS. 1 and 2A-2B, consider the heat flux flowing along the positive x-direction in FIG. 2A (forward structure) and FIG. 2B (reverse structure). In the forward structure (FIG. 2A) the second region 16 is more heavily doped than the first region 12, while in the reverse case (FIG. 2B), the second region 16 is more lightly doped than the first region 12. For both cases, the second region 16 dominates the thermal resistance because L2>>L1. For the forward structure (FIG. 2A), the positive charge current flux, $J_p$ (for electrons, the current density is $-J_p$) and the energy flux, $J_E$, across the interface can be expressed as, $$J_p = \frac{em_1^* k_B^2}{2h^3 \pi^2} \left\{ \int_0^\infty \left[ \frac{T_{e1}^2 y}{e^{y+(E_{c1}-E_{f1})/\kappa_B T_{e1}} + 1} - \frac{T_{e2}^2 y}{e^{y+(E_{c1}-E_{f2})/\kappa_B T_{e2}} + 1} \right] dy \right\} \quad (1)$$

$$= AT_{e1}^2 \{F_1(\xi_{11}) - (T_{e2}/T_{e1})^2 F_1(\xi_{12})\}$$

$$J_E = (\kappa_B/e) AT_{e1}^3 \{F_2(\xi_{11}) - (T_{e2}/T_{e1})^3 F_2(\xi_{12})\} + E_{c1} J_p/e \quad (2)$$

where $A = em_1^* k_B^2 / 2h^3 \pi^2$ is the Richardson constant, $y = E_k/kT$ is nondimensional kinetic energy, $\xi_{11} = [(E_{f1}-E_{c1})/(k_B T_{e1})]_{x=0^-}$ and $\xi_{12} = [(E_{f2}-E_{c1})/(k_B T_{e2})]_{x=0^+}$ are reduced Fermi levels at the two sides of the interface 14, $E_f$ is the electrochemical potential, $m_1^*$ is the electron effective mass in the first region 12 (also referred to herein as region 1), $T_{e1}$ and $T_{e2}$ are the temperatures of the electrons coming towards the interface 14 from the first region 12 or the second region 16 (also referred to herein as region 2), respectively, and $F_n$ is the Fermi-Dirac integral, $$F_n(\xi) = \int_0^\infty \frac{y^n}{e^{y-\xi} + 1} dy \quad (3)$$

Also, notice that the reference energy for both Fermi-Dirac distributions in Eq. (1) is $E_{c1}$ and effective mass is taken to be that of the region 1, because the transmissivity from 2 to 1 is less than unity. The derivation of Eq. (1) requires the principle of detailed balance. For nondegenerate semiconductors under the assumption of $T_{e1}=T_{e2}$, Eq. (1) gives the familiar Richardson formula for thermionic emission, which is known to those of skill in the art. For nondegenerate semiconductors under the open circuit condition, Equations (1) and (2) can be linearized with the following results:

$$J_{E,f} \approx 2\kappa_B (T_{e1} - T_{e2}) J_{R,f}/e \quad (4)$$

$$S_{i,f} \approx \frac{E_{f1} - E_{f2}}{e(T_{e1} - T_{e2})} = -\frac{\kappa_B}{e}\left(2 + \frac{E_{c1} - E_{f2}}{\kappa_B T_{e1}}\right) \quad (5)$$

where S is the Seebeck coefficient at the interface and $$J_{R,f} = AT_{e1}^2 e^{-(E_{c1}-E_{f1})/(\kappa_B T_{e1})} = AT_{e1}^2 e^{\xi_{11}} \quad (6)$$

Equation (5) differs from some relationships provided by some others in the prior art (e.g., those provided by G. D. Mahan, J. O. Sofo, and M. Bartkowiak, J. Appl. Phys., 83, 4683 (1998) (hereinafter "Mahan reference")). In the Mahan reference, $(E_{c1}-E_{f2})$ is replaced by the barrier height. This small difference, however, is not important. Both the derivation described here and that of the Mahan reference show that there is generally a Seebeck effect at the interface.

A similar analysis under identical approximations (nondegenerate semiconductor and linearization) for the reverse structure (FIG. 2B) gives $$J_{E,r} \approx 2\kappa_B (T_{e1} - T_{e2}) J_{R,r}/e, \quad (7)$$

$$S_{i,r} \approx -\frac{\kappa_B}{e}\left(2 + \frac{E_{c2} - E_{f2}}{\kappa_B T_{e1}}\right) \quad (8)$$

where $$J_{R,r} = AT_{e1}^2 \exp[(E_{c2} - E_{f1})/(\kappa_B T_{e1})]. \quad (9)$$

Comparing $S_{i,f}$ and $S_{i,r}$, it can be seen that $S_{i,f}$ is larger than $S_{i,r}$ if $E_{c2}-E_{f2}$ is fixed by the doping in the second region 16. It should be noted, however, that the Seebeck coefficient difference between Eq. (5) and Eq. (8) is not the major reason for the amplified interface Seebeck voltage, because the interfacial voltage drop is proportional to the electron temperature drop. Usually, when the electrons and phonons are at equilibrium, there is only a very small electron temperature drop over the interface region, and thus the interfacial Seebeck voltage is negligible compared to the Seebeck voltage developed in region 2, where most temperature drop occurs.

An important discovery of the present invention is that a large electron temperature drop can develop across the interface 14 in the forward structure as in FIG. 2A but it cannot be generated in the reverse structure as in FIG. 2B. To see how this can occur, it can be seen from Eq. (4) that the electron temperature difference depends on the energy flux $J_E$ across the interface. Energy conservation requires that this $J_E$ must match the energy flux at the two sides of the interface. Because the second region 16 (also referred to herein as "region 2") is long, it dominates the transport in the whole device. The electron energy flux in region 2, under the normal drift-diffusion approximation, is given by, $$J_{E2} = \pi_2 J_p - k_{e2} dT_{e2}/dx + E_{f2} J_p \tag{10}$$

where $\pi_2$ (=$T_{e2}S_2$) is the Peltier coefficient [the negative sign in front of $\pi_2$ is because the electron current flux equals $(-J_p)$], and $k_{e2}$ is the electronic contribution to the thermal conductivity. Under the open circuit, one can equate Eq. (4) or Eq. (9) to Eq. (10) for the continuity of the electron energy flux at the interface, so that, $$(T_{e1} - T_{e2})_{f,r} = -\frac{k_{e2}}{J_{E,f(or)r}} \frac{dT_{e2}}{dx} \tag{11}$$

This equation shows that the interface temperature drop depends on the ratio $k_{e2}/J_{E,f(or\ r)}$. The electronic thermal conductivity can be expressed as:

$$k_{e2} = \frac{1}{T_e^2}\left(K_2 - \frac{K_1^2}{K_o}\right) = LT_e\sigma = eLT_e n\mu \tag{1}$$

where $$K_s(\xi) = 16\pi\sqrt{2m^*}\, T_e\tau(\kappa_B T_e)^{s+3/2} F_{s+1/2}(\xi)/(3h^3) \tag{2}$$

$\xi=(E_f-E_c)/(\kappa_B T_e)$ is again the reduced Fermi level, L is the Lorentz number which generally depends on $\xi$, n is the carrier concentration, $\mu$ the mobility, and $\tau$ is the energy-independent relaxation time. For nondegenerate semiconductors, Eq. (11) reduces to $$(T_{e1} - T_{e2})_{f,r} = \tag{3}$$

$$-\frac{5}{4}\tau\sqrt{\frac{2\pi m_2^* \kappa_B T_{e2}}{m_1^{*2}}}\frac{e^{-(E_{c2}-E_{f2})/(\kappa_B T_{e2})}}{e^{-(E_{c1}-E_{f1})/(\kappa_B T_{e2})}}\frac{dT_{e2}}{dx} \sim e^{\Delta/(\kappa_B T_e)}\Lambda_{e2}\frac{dT_{e2}}{dx}$$

where $\Lambda_{e2}$ is the electron mean free path, and $\Delta$ is the height of the potential step ($E_{e1}$-$E_{e2}$), or the potential barrier. Equation (14), although approximate, holds the key to the realization of the amplified nonequilibrium electron-phonon behavior that is applied in the semiconductor structures of the invention. In a homogeneous semiconductor, the electron temperature drop over one mean free path is $\sim\Lambda_e dT_e/dx$, which is usually very small. Under the forward structure in FIG. 2A, the potential step amplifies the temperature drop by $\sim e^{\Delta a/(\kappa_k T_e)}$. This amplifying factor is caused by the carrier density difference between the drift-diffusion current on the lower potential side and the thermionic current from the higher potential side. This is not the case for the reverse structure in FIG. 2B. For the latter case, equation (9) shows that $E_{e2}$ in $J_{E,r}$ cancels $E_{e2}$ in $k_{e2}$. The electron temperature drop at the interface is negligible and no appreciable interfacial electrochemical discontinuity develops for the reverse thermal bias condition.

The analysis described includes several assumptions that may be changed or relaxed. First, semiconductors used in thermoelectrics are usually degenerate and the carrier distribution function generally cannot be approximated by Boltzmann statistics. Second, if a large electron temperature drop occurs at the interface, the linearized expressions, Eqs. (4), (5), (7), and (8) might not be valid. In addition, it is useful to determine the electron temperature gradient near the interface and the closed circuit characteristics. It is not necessarily appropriate to assume that the electron temperature distribution is linear, because phonon temperature generally does not follow the electron temperature distribution.

To help address these issues, a two-temperature semiconductor device model, which separates electron and phonon temperatures, is useful to deal with this situation. Two temperature models generally have been used to study nonequilibrium between electrons and phonons and to deal with hot electron transport in semiconductor devices, thermoelectric effects, and short pulse laser-material interactions. In the following discussion, the two-temperature equations are briefly formulated, then the boundary conditions above are discussed, and then focus is on discussion of the boundary conditions.

Using the two-temperature model, which assumes that electrons and phonons are in equilibrium with their own subsystems and exchange energy through electron-phonon scattering, the governing equations for electron and phonon transport in each region are:

$$\frac{d}{dx}\left(k_{ei}\frac{dT_{ei}}{dx}\right) - G_i(T_{ei} - T_{pi}) + \frac{J_{pi}^2}{\sigma_i} = 0 \tag{15}$$

$$\frac{d}{dx}\left(k_{pi}\frac{dT_{pi}}{dx}\right) + G_i(T_{ei} - T_{pi}) = 0 \tag{16}$$

where the subscript i=1, 2 for each side of the interface, $T_p$ is the phonon temperature, $k_p$ is the phonon thermal conductivity, and G is the electron-phonon coupling factor. These equations are solved coupled to the previously discussed interface conditions to obtain the interface electrochemical potential and electron temperature discontinuities. The Fermi-Dirac distribution and the nonlinearity of the interface conditions are fully included through an iterative procedure. Once the interface electrochemical potential discontinuity and the interface temperature drop are obtained, the total voltage developed through the whole structure is calculated from, $$V = -S_{1o}[T_{e1}(-d_1) - T_{e1}(0)] + [E_{f2}(0^+) - E_{f1}(0^-)]/e - S_{2o}$$
$$[T_{e2}(0) - T_{e2}(d_2)] \tag{17}$$

where $S_{1o}$ and $S_{2o}$ are the average Seebeck coefficient in region 1 and 2, respectively. Using this voltage, an equivalent Seebeck coefficient can be defined as $S = -V_o/(T_h - T_c)$.

In FIGS. 4-12, described below, the graphed data is based upon the above-described model, including use of a Fermi-Dirac distribution. Equations (1)-(14) are based on a Boltzmann distribution, to make the principle easier to understand.

Figure 4:
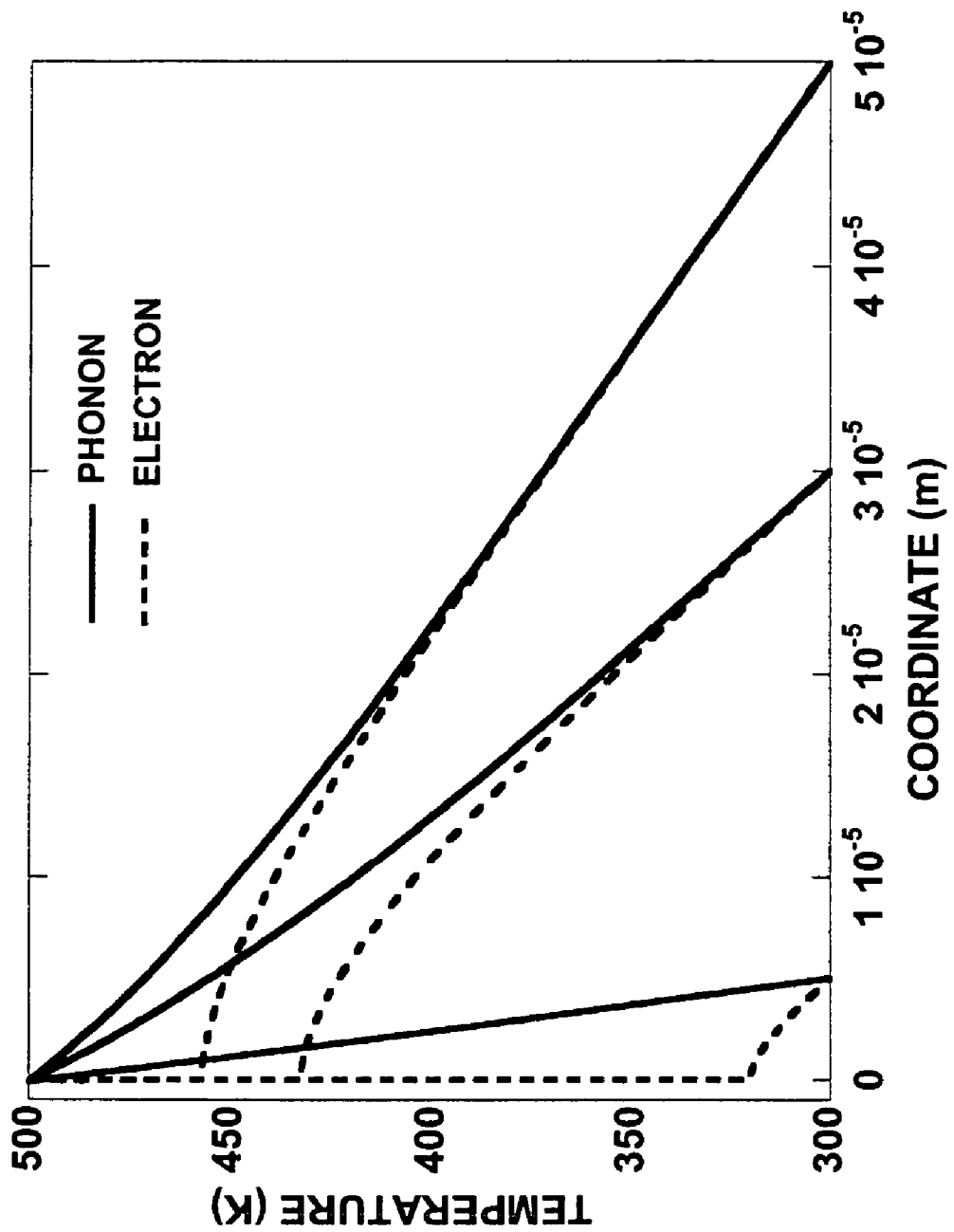
FIG. 4 is a graph showing electron and phonon distributions, under the forward heat flux conditions of FIG. 2A, for three different lengths of the second region.
Figure 5:
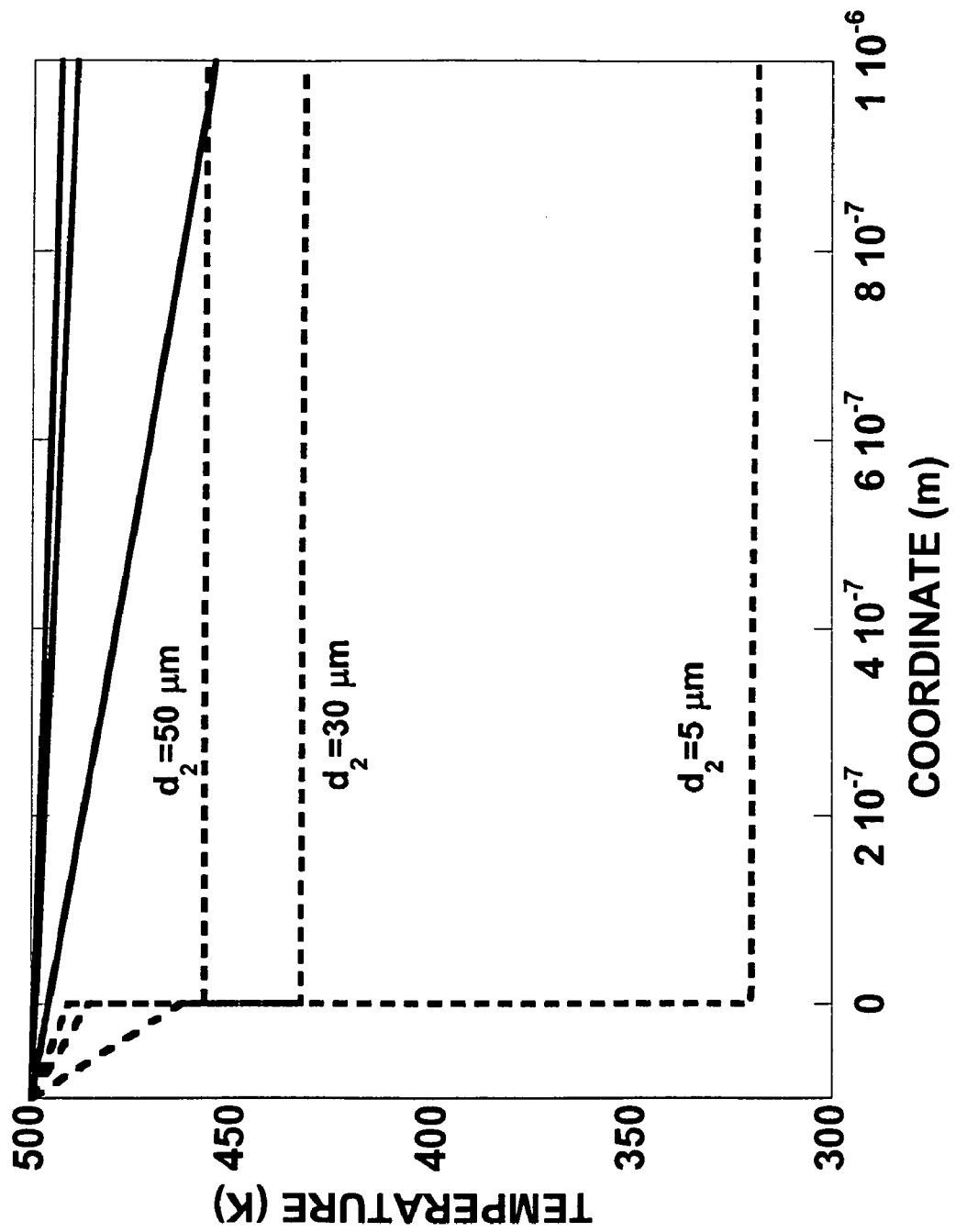
FIG. 5 is a graph showing electron and phonon distributions at the interface region, under the forward heat flux conditions of FIG. 2A, for three different lengths of the second region.

FIG. 4 is a graph showing electron and phonon temperature distributions, under the forward heat flux conditions of FIG. 2A, for three different lengths of the second region, in accordance with one embodiment of the invention. FIG. 5 is a graph showing electron and phonon temperature distributions at the interface region, under the forward heat flux conditions of FIG. 2A, for three different lengths of the second region, in accordance with one embodiment of the invention. As FIG. 5 illustrates, a large electron temperature jump develops near the interface region (the point 0 on the x-axis), while the phonon temperature distributions are essentially continuous across the interface. FIG. 4 corresponds to a structure with the following parameters:

$\delta=\Delta/(k_B T_a)=10$,
$\mu=20,000$ cm$^2$/Vs
$m^*=0.014$ $m_e$,
$G=10^{10}$ W/m$^3$K,
$k_p=1$ W/mK,
$n2=3.18\times10^{17}$ cm$^{-3}$, and
$n1=5.8\times10^{16}$ cm$^{-3}$.

The above parameters are provided by way of example only and are not limiting.

FIG. 4 shows the electron and phonon temperature distributions for the above parameters under the forward heat flux condition. The parameters chosen for FIG. 4 are similar to those of III-V semiconductors and typical thermoelectric materials. Among these parameters, the electron-phonon coupling, G, can tend to be the most uncertain. Preferably, G should be related to the mobility and the carrier concentration. In the graph of FIG. 4, G has been taken to be a substantially "free" parameter with a reasonable range of values. Note that, for metals, G varies from $10^{14}$-$10^{16}$ W/m$^3$K. Semiconductors have smaller carrier density and a smaller G, typically ~$10^{10}$-$10^{14}$ W/m$^3$K. At lower temperatures, G can be smaller.

Figure 10:
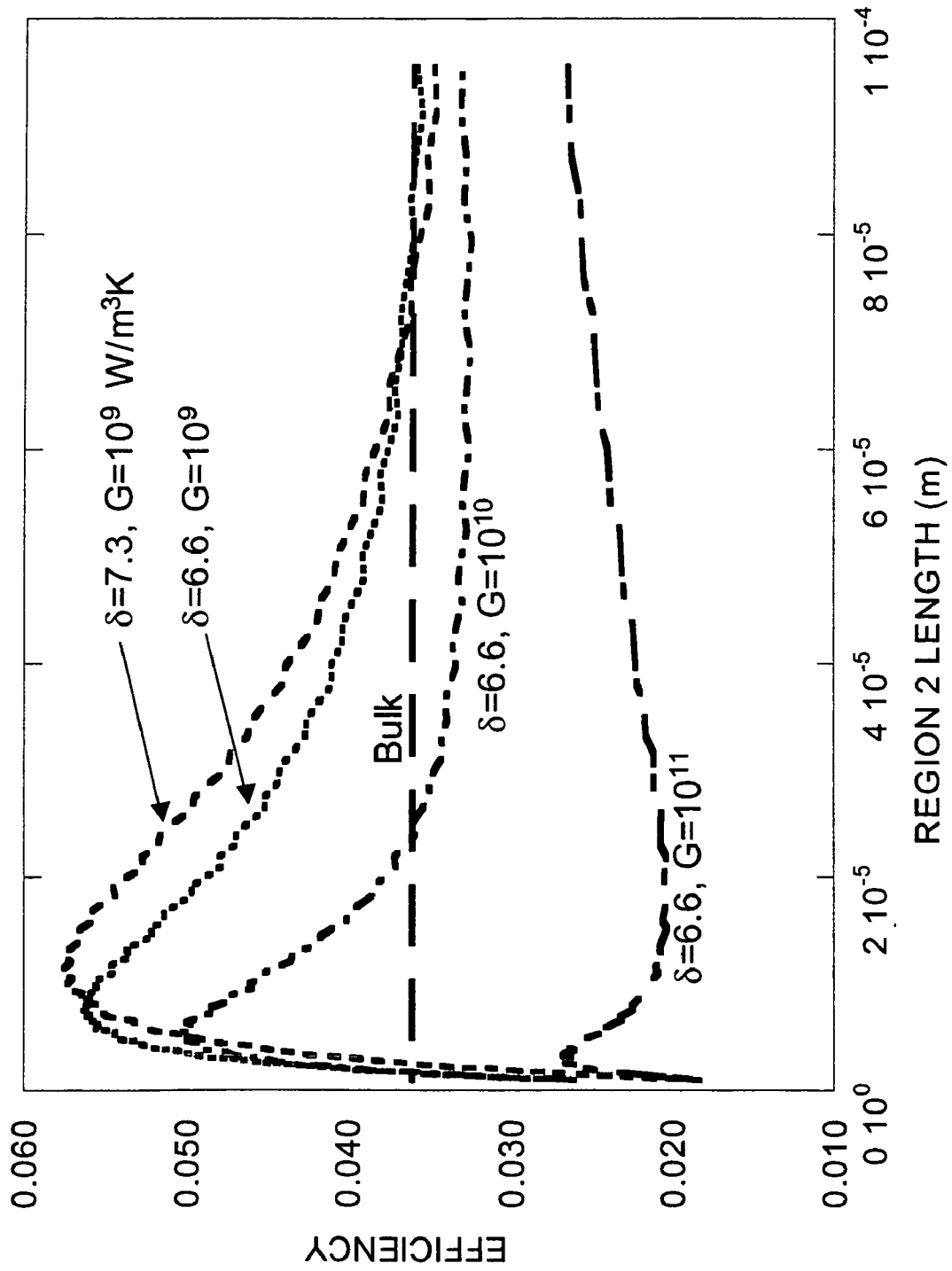
FIG. 10 is a graph showing efficiency versus length of the second region for various embodiments of semiconductor structures and comparing these efficiencies to a pure (bulk) thermoelectric element.

Under proper conditions, for semiconductor structures developed in accordance with the invention, a large electron temperature drop can develop at the interface, as shown in FIG. 5. Electrons and phonons are at a highly nonequilibrium state near the interface (i.e., the x=0 location of FIGS. 4 and 5). As the second region 16 (FIG. 1) becomes shorter (which is shown, for example, as the length D2 in FIG. 5), the electron temperature discontinuity becomes larger because the electron diffusion energy flux in region 2 is larger, which drives the nonequilibrium at the interface further apart. Note that although the second region 16 should be longer than the first region 12, so that the electrical resistance of the second region 16 is dominant, the second region 16 should not be excessively long. If the second region 16 is too long, much of the electron temperature drop will occur within the second region 16, rather than at the interface 14. FIG. 10, for example (described further herein), shows that an optimum length exists that maximizes the efficiency. The exact optimum value depends on the parameters of the materials used, including but not limited to the types of parameters discussed above in connection with FIG. 4, as well as parameters such dopant concentration, dopant type, dopant distribution, mobility, electrical and thermal conductivity, barrier height, band structure, electron-phonon coupling factor, length of first and second regions, the interface sharpness, and the contact region. Correspondingly, the electron temperature drop in the second region 16 is reduced. Since the interface Seebeck coefficient, as is approximately given by Eq. (8), is much larger than the bulk Seebeck coefficient in the second region, an increase will be seen in the output voltage later.

Figure 6:
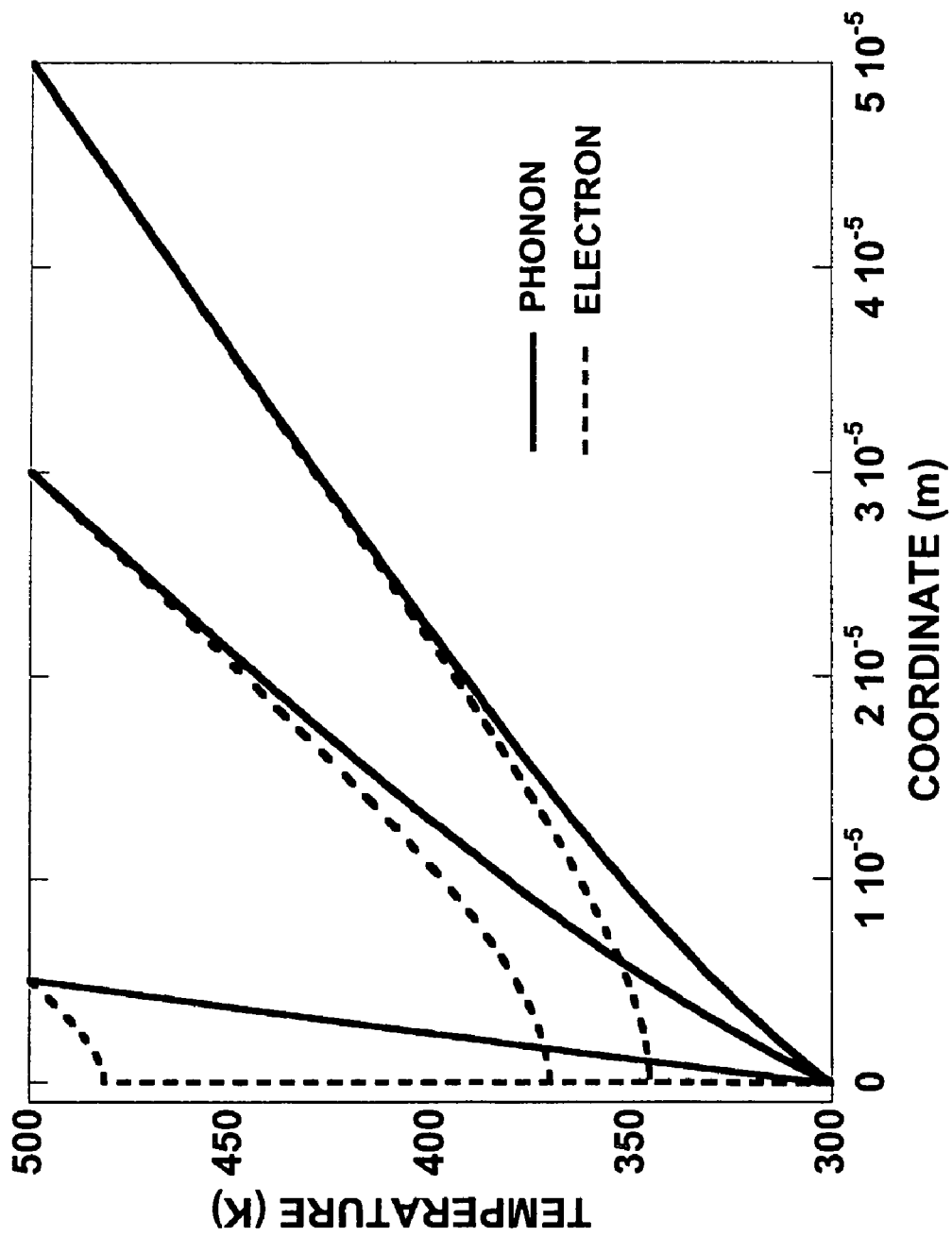
FIG. 6 is a graph showing electron and phonon distributions under the reverse heat flux conditions of FIG. 2A, for three different lengths of the second region.
Figure 7:
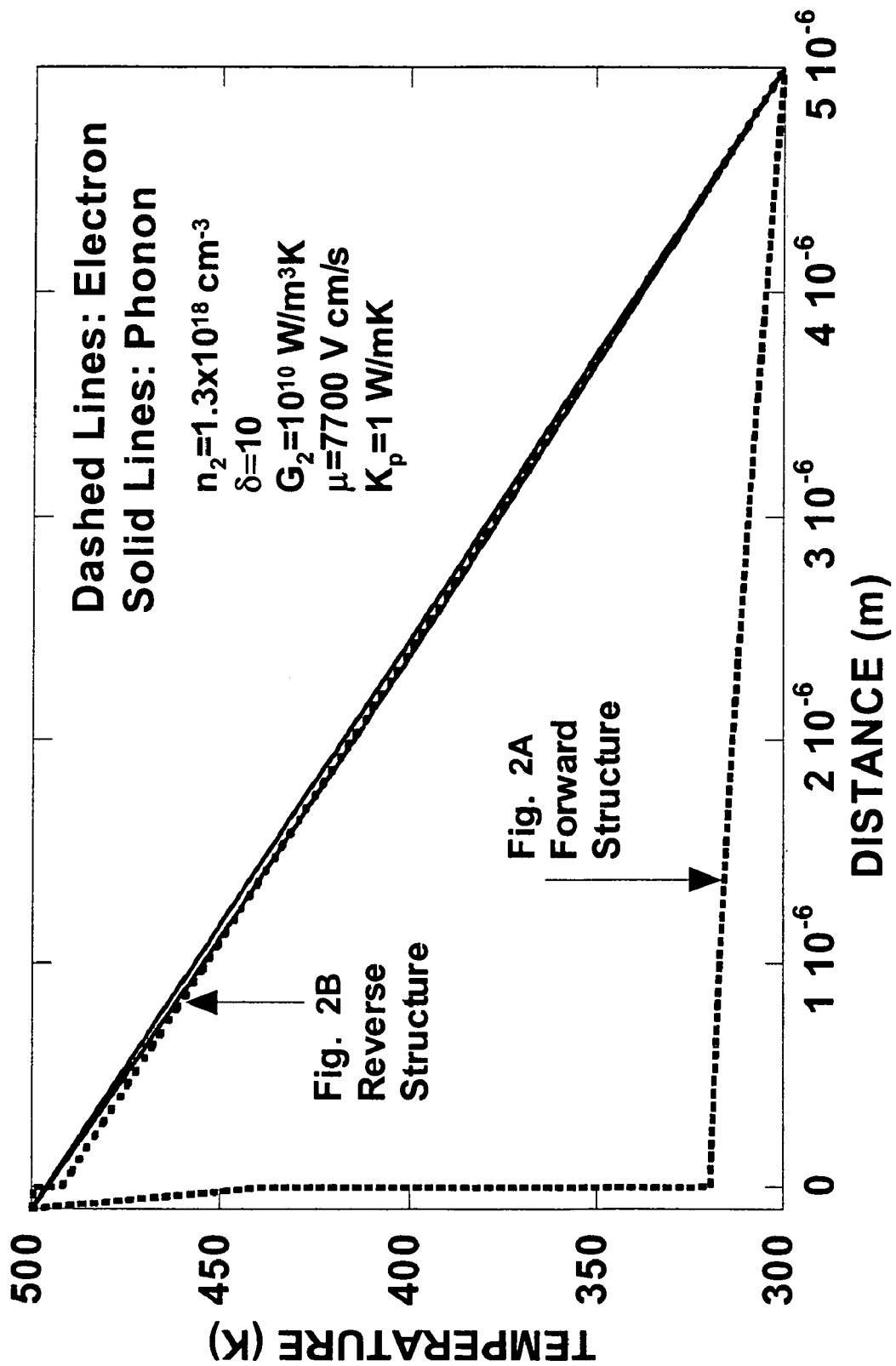
FIG. 7 is a graph comparing temperature distributions for the forward semiconductor structure of FIG. 2A and the reverse semiconductor structure of FIG. 2B.

If the temperature gradient for the semiconductor structure of FIG. 2A is reversed, similar nonequilibrium between electrons and phonons occurs but the electrons become hotter than phonons. This is shown in FIG. 6, which is a graph that shows electron and phonon distributions under the reverse heat flux conditions of FIG. 2A, for three different lengths of the second region 16. This suggests that both interfaces of a narrow potential barrier, as shown in FIG. 3G, can contribute to the described effect. However, the reverse structure (FIG. 2B) does not develop an appreciable temperature jump at the interface (the point "0" on the x-axis of FIG. 7), as also shown in FIG. 7, which is a graph that compares the electron and the phonon temperature distributions for the forward and the reverse structure as shown in FIGS. 2A and 2B when heat flux is along positive direction. In the context of FIG. 3G, this reverse potential barrier would appear as a potential dip, and will not have the nonequilibrium effects described here. Although, in FIG. 7, the semiconductor structure has slightly different parameters (as shown in the graph of FIG. 7) than the semiconductor structure of FIGS. 5 and 6, the general conclusion that reverse structure 2B does not work holds.

Figure 8:
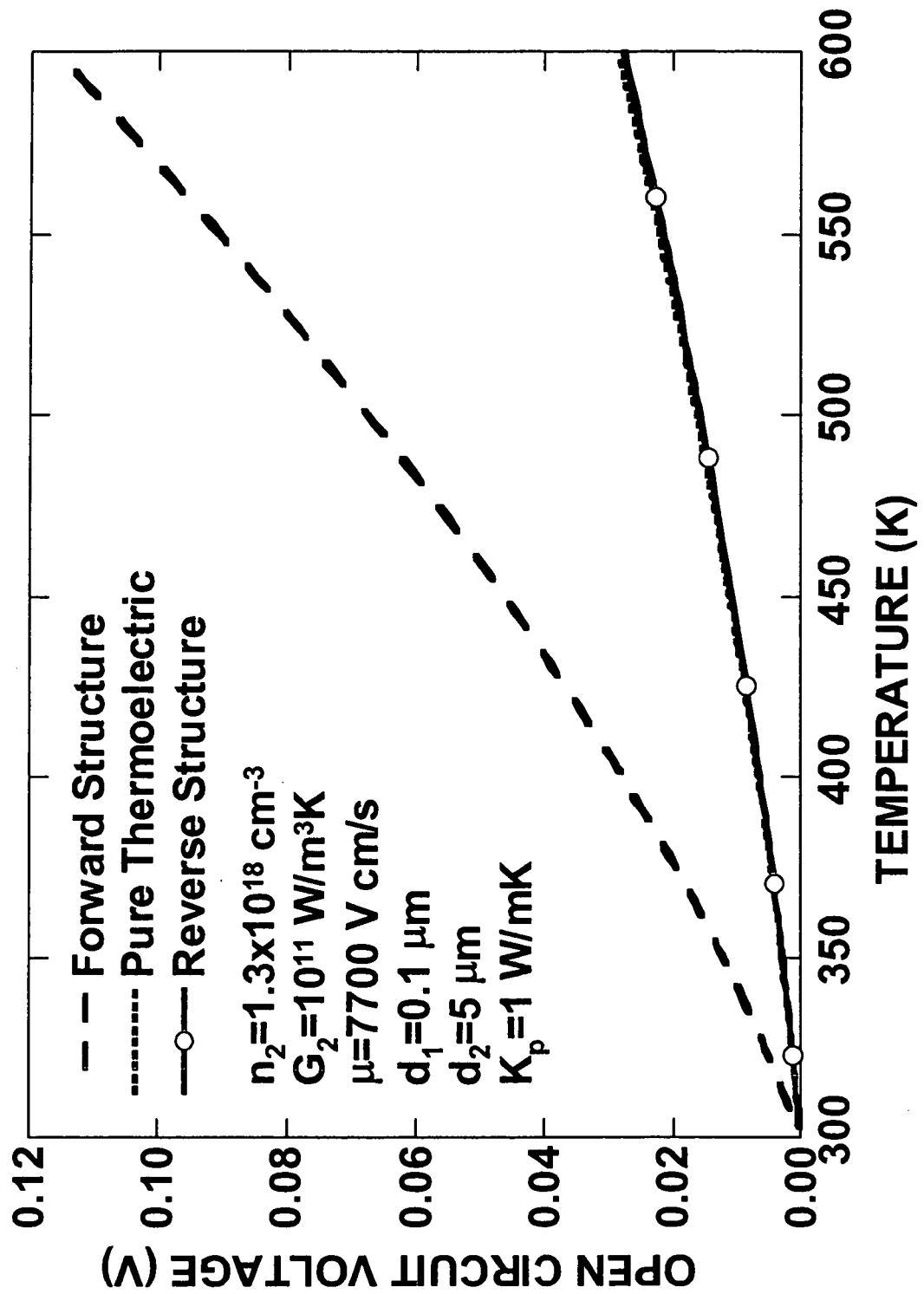
FIG. 8 is a graph comparing, for the device of FIG. 1, open circuit voltage under the under the forward heat flux conditions of FIG. 2A, open circuit voltage under the forward heat flux conditions of FIG. 2B, and open circuit voltage of a pure thermoelectric element having the same doping as the second region of FIG. 1.

FIG. 8 is a graph comparing, for the device of FIG. 1, open circuit voltage under the under the forward heat flux conditions of FIG. 2A, open circuit voltage under the forward heat flux conditions of FIG. 2B, and open circuit voltage of a pure thermoelectric element having the same doping as the second region of FIG. 1 (i.e., if the entire semiconductor structure of FIG. 1 were made of a uniform thermoelectric material having the same thermoelectric properties as that of the second region), in accordance with one embodiment of the invention. In this context, "forward" means heat flow along positive x-direction. The open circuit voltages of the devices in FIGS. 2A and 2B are shown in FIG. 8 as a function of the temperature difference applied and compared with the case of a pure thermoelectric material under the same temperature difference.

In FIG. 8, the second region 16 of the semiconductor structure 10 for FIG. 8 has the same doping as in the optimized thermoelectric material. FIG. 8 shows that the forward device structure shown in FIG. 2A can have a significantly higher open-circuit voltage, but the reverse device structure shown in FIG. 2B cannot. In fact, the reverse structure has an output voltage that is essentially identical to the output voltage of a pure thermoelectric device. This increased open circuit voltage for the forward structure arises from the larger Seebeck voltage at the interface region. As noted previously, only when a large electron temperature difference develops at the interface can one take advantage of this large interfacial Seebeck coefficient, which is the case for the semiconductor structure of FIG. 2A but not for the semiconductor structure of FIG. 2B.

Figure 9:
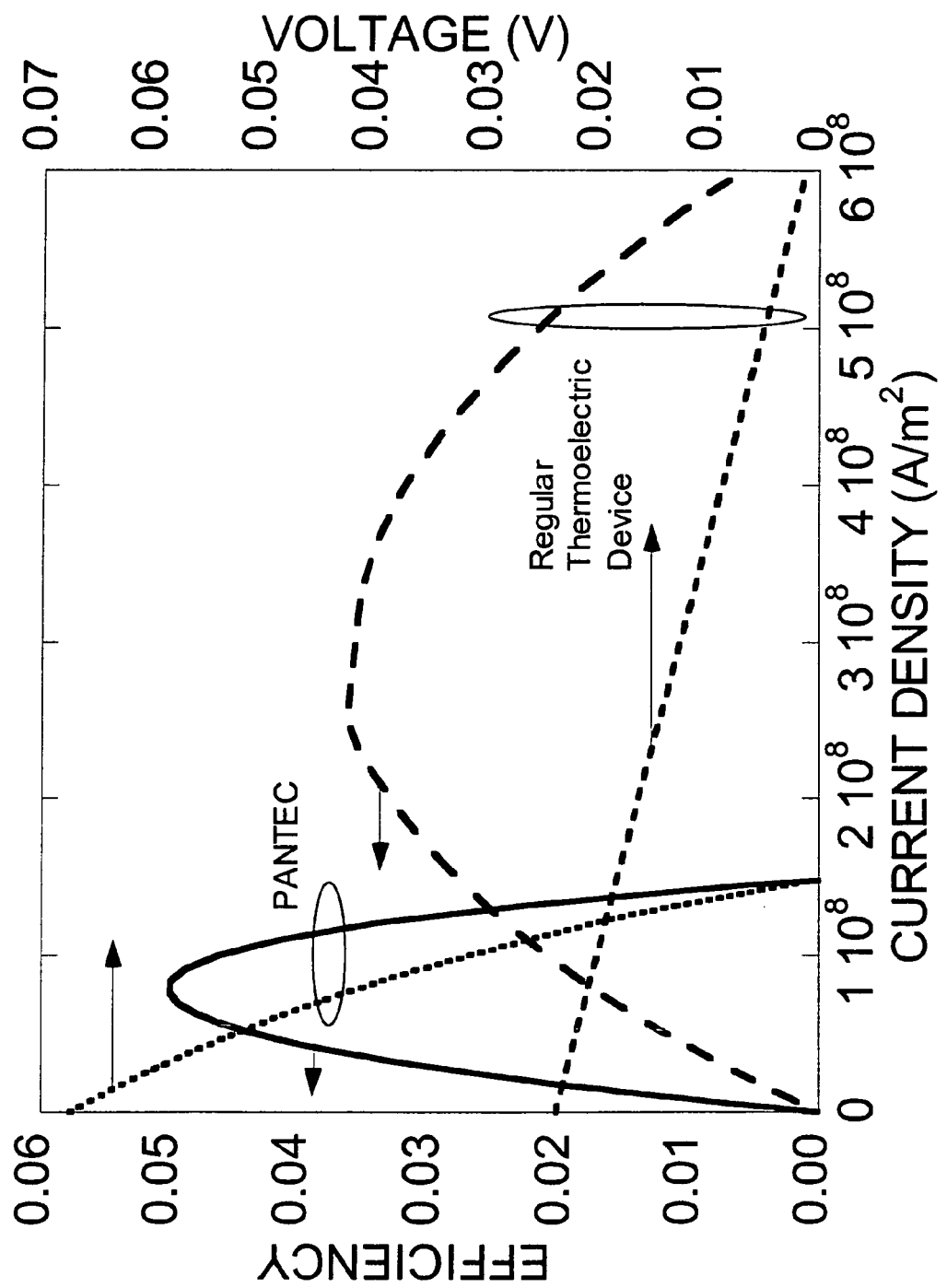
FIG. 9 is a graph comparing the power generation under load for the semiconductor structure device of FIG. 1 with the power generation under load of a regular thermoelectric device.

The equivalent thermoelectric figure of merit based on the open circuit voltage, the equivalent resistivity and the equivalent Seebeck of the whole semiconductor structure can be large. However, research conducted in accordance with the invention has found that the equivalent ZT is not a proper measure of the performance of the device and thus will present instead the actual device performance. Note that the graphs of FIGS. 4 through 8 are associated with a so-called "power generation" mode of the semiconductor structure 10 of FIG. 1. FIG. 9 is a graph comparing the power generation under load for the semiconductor structure 10 of FIG. 1 (labeled as a PANTEC device in FIG. 9) with the power generation under load of a regular thermoelectric device, in accordance with one embodiment of the invention. For the semiconductor structure whose data is shown in FIG. 9, the following parameters were used:

$\delta=\Delta/(k_B T_a)=6$,
$\mu=20,000$ cm$^2$/
$m^*=0.014$ $m_e$,
$G=10^{10}$ W/m$^3$K,
$K_p=1$ W/mK
L1=100 Angstroms
L2=4.6 µm
$T_h$=500K (hot temperature)
$T_c$=300K (cold temperature)

The above parameters are provided by way of example only and are not limiting.

In particular, FIG. 9 shows the efficiency as a function of the current density flowing through the semiconductor structure for a power generation configuration, and the corresponding thermoelectric device voltage output. Compared to thermoelectric devices, the semiconductor structure of FIG. 1 has a narrower performance range (i.e., narrower current density), but can have significantly higher efficiency. The efficiency depends on the doping concentration in the second region 16, the lengths L1 and L2 of the first and second regions, respectively, the barrier height, and physical properties.

Note that the graph for FIG. 9 did not attempt to optimize all the parameters for the maximum efficiency. FIG. 10 is a graph showing efficiency versus length of the second region for various embodiments of the semiconductor structure 10 of FIG. 1 and compares these efficiencies to a pure (bulk) thermoelectric element, in accordance with one embodiment of the invention. FIG. 10 shows the efficiency variation as a function of the length L2 of the second region 16. FIG. 10 also illustrates that when the electron-phonon coupling factor G is small (e.g., for G=$10^9$ W/m$^3$K), the semiconductor structure 10 can have an efficiency higher than conventional thermoelectric devices (shown as the "bulk" line in FIG. 10).

Figure 11:
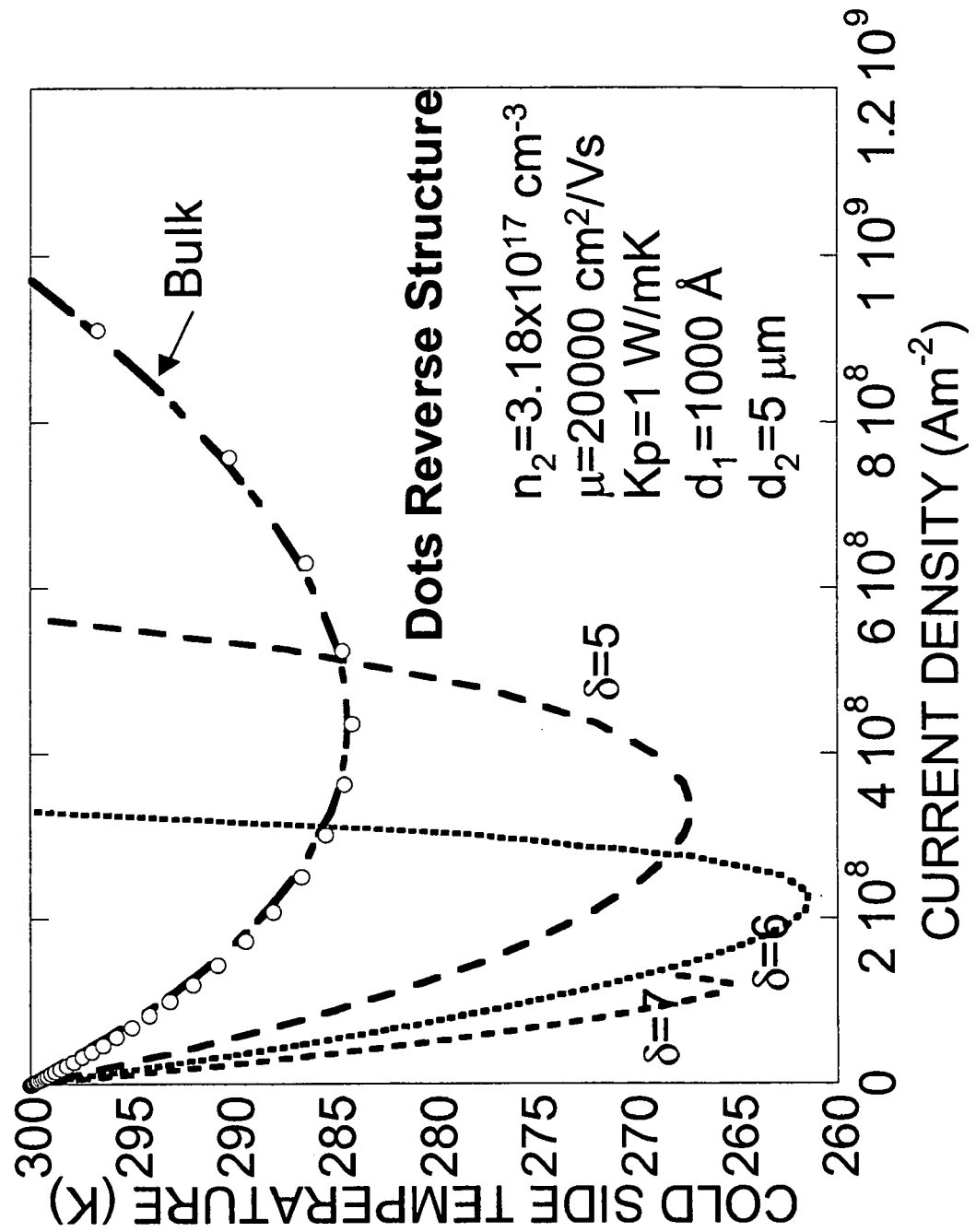
FIG. 11 is a graph comparing cold side temperature as a function of current density for the semiconductor structure of FIG. 2A, in refrigeration mode, with the current density as a function of temperature of a pure thermoelectric element having the same doping as the second region of FIG. 1, and with the current density as a function of temperature for the semiconductor structure of FIG. 2B.

The semiconductor structure 10 of FIG. 1 also works for refrigeration (cooling) but the temperature distribution is drastically different. FIG. 11 is a graph comparing cold side temperature as a function of current density for the semiconductor structure of FIG. 1, in refrigeration mode, under the forward structure of FIG. 2A, with the current density as a function of temperature of a pure thermoelectric element having the same doping as the second region of FIG. 1, in accordance with one embodiment of the invention. FIG. 11 illustrates the lowest temperature that the semiconductor structure 10 can reach with different barrier heights. For the device parameters given, the optimal barrier height is around 6 times $k_B T_h$. Also in FIG. 11, it can be seen that that the performance of the semiconductor structure (FIG. 2B) is substantially identical to that of a thermoelectric device. FIG. 11 shows that the forward semiconductor structure (FIG. 2A) structure can reach a significantly lower temperature, while the performance of the reverse semiconductor structure (FIG. 2B) is nearly identical to that of bulk device.

Figure 12:
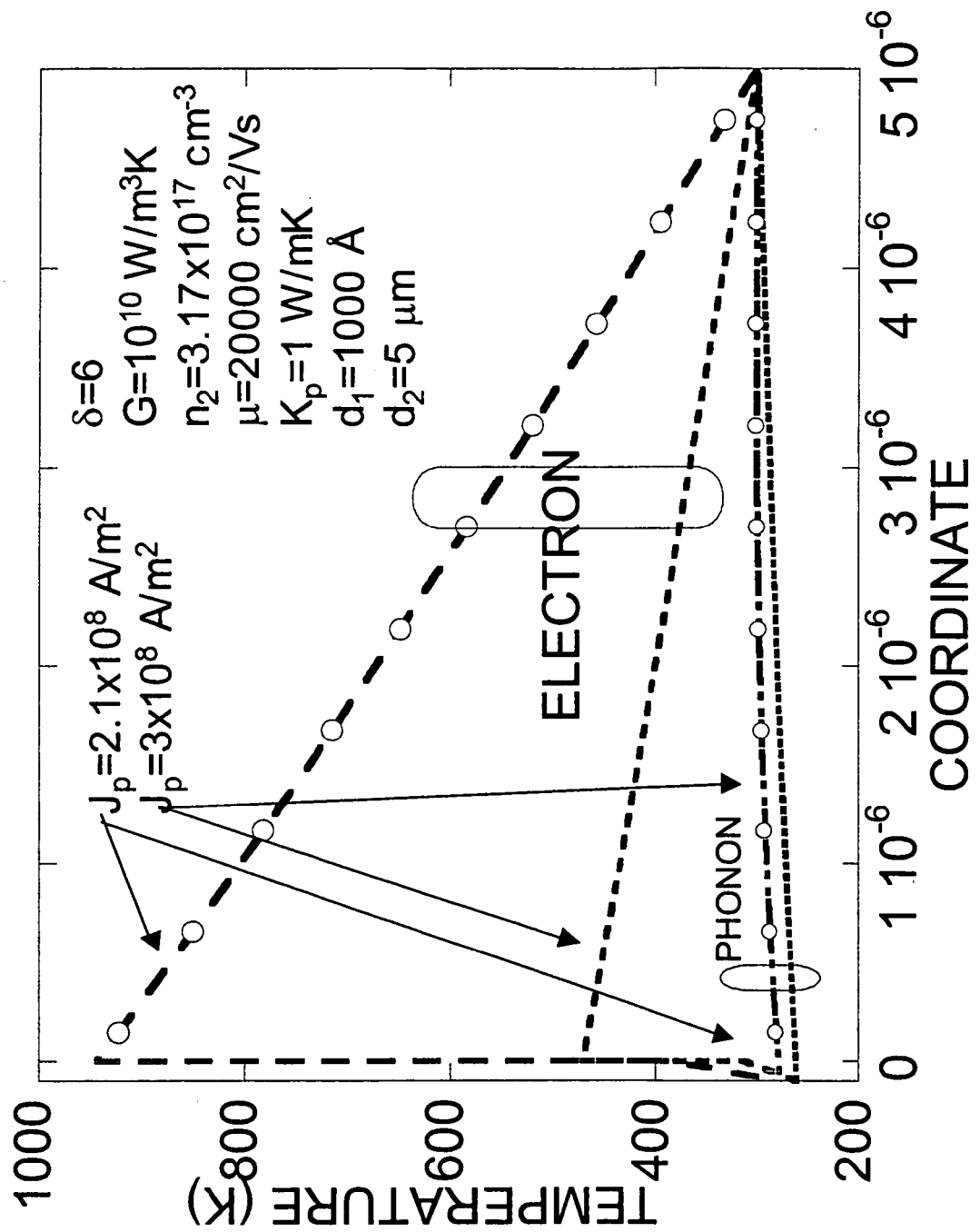
FIG. 12 is a graph showing electron and phonon temperature distributions for the device structure in FIG. 2A, in refrigeration mode.

FIG. 12 is a graph showing electron and phonon distributions under the forward heat flux conditions of FIG. 2A, in refrigeration mode, in accordance with one embodiment of the invention. FIG. 12 illustrates the electron and phonon temperature distributions at two current densities for $\Delta/(k_B T_h)$=6. Other parameters used for the graph of FIG. 12 include:

$\delta=\Delta/(k_B T_a)$=6,
$\mu$=20,000 cm$^2$/
G=$10^{10}$ W/m$^3$K,
$k_p$=1 W/mK
L1=100 Angstroms
L2=5 μm
$n_2$=3.17×$10^{17}$ cm$^{-3}$ The above parameters are provided by way of example only and are not limiting.

As FIG. 12 illustrates, the temperature distribution differs drastically from those shown in FIG in FIGS. 4-9. In FIG. 12, electrons driven down a potential barrier convert the potential energy into kinetic energy, and become hot. These hot electrons carry more heat because the Peltier coefficient is proportional to the electron temperature. The high electron temperature leads to lower phonon temperature that can be reached at the cold end. The figure of merit Z at 300 K for the second region 16 is 0.43×$10^{-3}$. The equivalent figure of merit for the forward device structure, calculated based on the lowest temperature that can be reached is 1.15×$10^{-3}$. This is a factor of 2.7 improvement over bulk materials.

The embodiments of the invention described and modeled herein show clearly that a large nonequilibrium between electrons and phonons can be created in a forward potential step structure. This large nonequilibrium is caused by the carrier density difference between the drift-diffusion current on the lower potential side and the thermionic current from the higher potential side. The large temperature difference leads to large thermoelectric effects at the interface that can be exploited for cooling and power generation applications. Further, the modeling results described herein show that properly designed devices, such as the semiconductor structure 10 of FIG. 1 and other PANTECs, can lead to potentially higher efficiency for both power generation and refrigeration than pure thermoelectric devices made of the same materials.

The effects can also be integrated into the design of microelectronic and optoelectronic devices. The devices described herein can be used for cooling, heat pumping, and power generation for a wide variety of devices. Examples for power generation include conversion of heat into electricity, with various heat sources from various combustors, from exhaust of automobiles and boilers, from the sun, and from waste heat of electronic devices. Examples of refrigeration and heat pump include household refrigerators and heat pumps, compact refrigerators, coolers for semiconductors and microelectronic devices. The devices can also be combined directly into the design of semiconductor devices such as lasers, detectors, and microelectronic devices.

Figure 13:
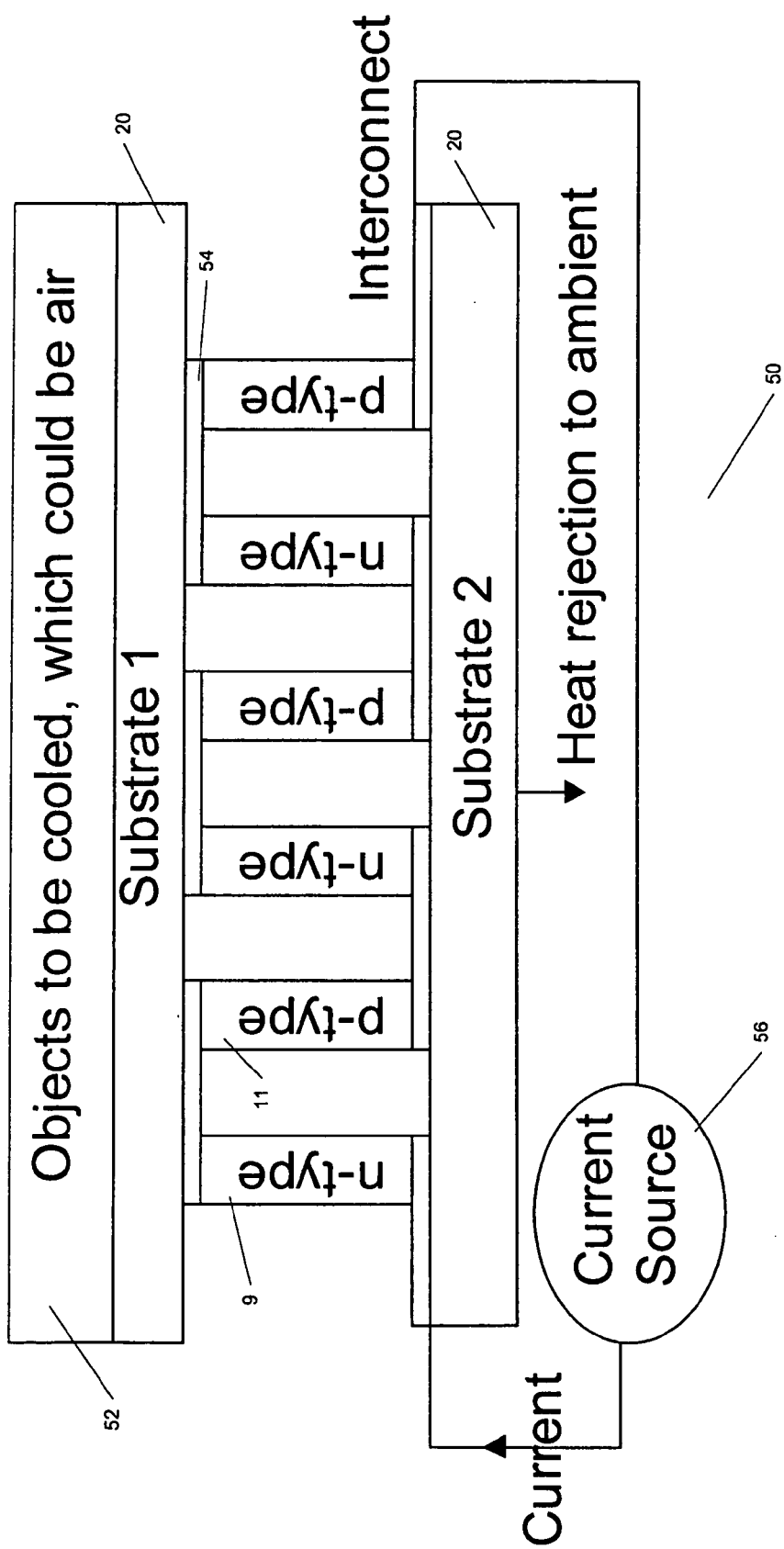
FIG. 13 is an illustrative cross-sectional view of an implementation using the device of FIG. 1 for cooling or heating.

For example, FIG. 13 is an illustrative cross-sectional view of an implementation of the invention that uses the device of FIG. 1 for cooling or heating. Referring to FIG. 13, a heating/cooling system 50 is shown. The system 50 includes a plurality of n-type semiconductor structures 9, a plurality of p-type semiconductor structures 11, a plurality of interconnects 54, and first and second substrates 20. The n and p-type semiconductor structures 9, 11 are thermoelectric devices, such as the PANTEC described herein. The plurality of n and p-type semiconductor structures are operably coupled together such that they are electrically in series and thermally connected together in parallel. Each n-type semiconductor structure 10 and p-type semiconductor structure 11 in the heating/cooling system 50 includes both a first region 12 and a second region 16 (similar to FIG. 1). The n and p-type semiconductor structures 9, 11 are connected electrically in series.

The system 50 is coupled to an object or area 52 that is to be cooled (refrigeration mode) or heated (heat pump mode). For example, the object or area 52 could be a microelectronic device, or it could be a relatively hot or warm region of air that is to be reduced to a lower temperature. The system 50 is also coupled to a current source 56. For cooling, a current from the current source 56 is applied in the direction shown in FIG. 13, such that heat removed from the object or area 52 and rejected to, e.g., ambient air. Note that, in the n-type devices, electrons will travel against the direction of the current flow, whereas in p-type devices, holes will travel along the current flow. Thus, for the system 50 as shown (with the current direction as shown), heat from the object or area to be cooled 52 is coupled via the first substrate 20, through each n-type semiconductor structure 9 and p-type semiconductor structure 11, through the second substrate 20, and to a source for receiving the heat, such as ambient air. The rejected heat could also be applied to a useful purpose, such as heating up a room or heating up a cold environment, such as a cold outdoor porch during the winter, such that the system 50 operates as a heat pump. The system 50 can also be used for heating, if the direction of the current source 56 is reversed.

Figure 14:
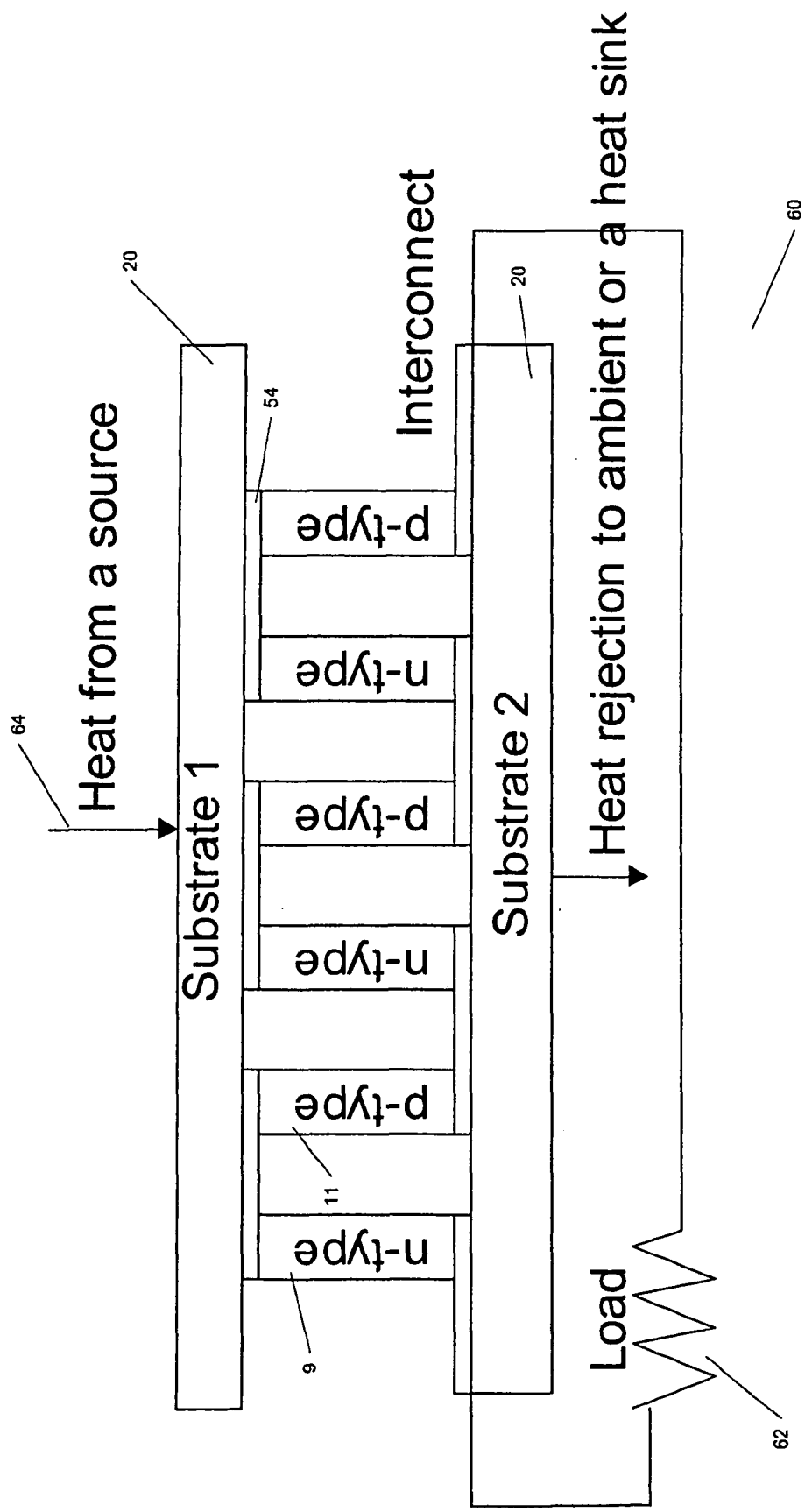
FIG. 14 is an illustrative cross-sectional view of an implementation using the device of FIG. 1 for power generation.

As another example, FIG. 14 is an illustrative cross-sectional view of an implementation using the device of FIG. 1 for power generation. Referring to FIG. 14, a power generation system 60 is shown. The system 60 includes a plurality of n-type semiconductor structures 9, a plurality of p-type semiconductor structures 11, a plurality of interconnects 54, and first and second substrates 20. Similar to the system 50 described above, the n and p-type semiconductor structures 9, 11 are thermoelectric devices, such as the PANTEC described herein, with each having first and second regions 12, 16, and are operably coupled together so as to be electrically connected in series and thermally connected together in parallel.

For power generation, the system 60 is connected such that the first region 12 in each n and p-type semiconductor structure 9, 11 is hot and the second region 16 in each n and p-type semiconductor structure 9, 11 is cooler. Thus, in FIG. 14, heat 64 is applied to the first substrate 20 (which is coupled to the first side of each n and p-type semiconductor structure 9, 11) from a source. The applied heat 64 is rejected at the cooler second substrate 20, which is coupled to the second region 16 in each n and p-type semiconductor 9, 11. Alternately, the cooler second substrate 20 could be coupled to another potential interface (i.e., between a first region and a second region). The heat can be rejected to ambient air or a heat sink and/or can be used to power a load 62.

In describing the embodiments of the invention illustrated in the figures, specific terminology (e.g., language, phrases, product brands names, etc.) is used for the sake of clarity. These names are provided by way of example only and are not limiting. The invention is not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, modules, tables, software modules, objects, data structures, servers, etc. Such terminology used herein, however, is for the purpose of description and not limitation.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention. In addition, the total number of elements shown for a particular structure and the dimensions and other parameters given for a particular structure or device is not intended to be limiting. Those skilled in the art can recognize that the numbers of a particular element, as well as the dimensions and other parameters, can be selected to accommodate the particular user needs.

Having described and illustrated the principles of the technology with reference to specific implementations, it will be recognized that the technology can be implemented in many other, different, forms, and in many different environments. The technology disclosed herein can be used in combination with other technologies.

In addition, those of ordinary skill in the art will appreciate that the embodiments of the invention described herein can be modified to accommodate and/or comply with changes and improvements in the applicable technology and standards referred to herein. Variations, modifications, and other implementations of what is described herein can occur to those of ordinary skill in the art without departing from the spirit and the scope of the invention as claimed.

The particular combinations of elements and features in the above-detailed embodiments are exemplary only; the interchanging and substitution of these teachings with other teachings in this and the referenced patents/applications are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto.

Having described the preferred embodiments of the invention, it will now become apparent to one of ordinary skill in the art that other embodiments incorporating their concepts may be used. These embodiments should not be limited to the disclosed embodiments, but rather should be limited only by the spirit and scope of the appended claims.

The invention claimed is:

1. A semiconductor structure, comprising
a first region, the first region having a first length and comprising a first semiconductor material doped with a first dopant to achieve a first carrier concentration;
a second region, the second region disposed adjacent to the first region so as to define a first interface, the second region having a second length which is longer than the first length and comprising a second semiconductor material doped with a second dopant to achieve a second carrier concentration, wherein the first carrier concentration in the first region is between 5.4 and 22.4 times smaller than the second carrier concentration in the second region and wherein both the first and second regions are n-type regions or both the first and second regions are p-type regions; and
wherein the first material, second material, first carrier concentration, second carrier concentration, first length, second length, first dopant, and second dopant are selected such that a forward electrical potential step is created at the first interface, the forward potential step having a barrier height dependent at least in part on an average temperature (T) of the semiconductor structure, wherein the forward potential step is defined such that a conduction band edge in the first region, at the first interface, is higher than a conduction band edge in the second region.

2. The semiconductor structure of claim 1, wherein the barrier height has a range of approximately 3-10 $\kappa_B T$, where $\kappa_B$ is the Boltzmann constant and T is the average temperature of the semiconductor structure.

3. The semiconductor structure of claim 1, wherein at least one of the first material, second material, first carrier concentration, second carrier concentration, first length, second length, first dopant, and second dopant is selected such that the barrier height has a range of approximately 3-10 $\kappa_B T$, where $\kappa_B$ is the Boltzmann constant and T is the average temperature of the semiconductor structure.

4. The semiconductor structure of claim 1, wherein the forward electrical potential step has a width smaller than the electron mean free path across the first interface.

5. The semiconductor structure of claim 1, wherein at least one of the first and second dopants has a profile optimized for current injection across the first interface.

6. The semiconductor structure of claim 1, wherein the second length is selected such that the second region is doped more heavily than the first region.

7. The semiconductor structure of claim 1, wherein the first and second materials are associated with respective first and second electrical resistances, wherein the first and second lengths are selected such that the second resistance is large enough, compared to the first resistance, to generate a temperature difference between a first electron temperature in the first region and a second electron temperature at the interface.

8. The semiconductor structure of claim 7, wherein the second electrical resistance is least 10 times as great as the first electrical resistance.

9. The semiconductor structure of claim 1, wherein at least one of the first and second semiconductor materials comprises a material having an electron-phonon coupling factor less than about $10^{12}$ W/m$^3$K.

10. The semiconductor structure of claim 1, wherein at least one of the first and second semiconductor materials comprises at least one of Mercury Cadmium Telluride (HgCdTe), cadmium arsenide ($Cd_3As_2$), $CaSnAs_2$, Cadmium Sulfide (CdS), Cadmium Selenium (CdSe), and Mercury Selenide (HgSe), Germanium (Ge) and SiGe alloy, Gallium Arsenide (GaAs) and its alloys, Bismuth Telluride ($Bi_2Te_3$), $Bi_2Se_3$, $Sb_2Te_3$, and their alloys, Gallium Phosphide (GaP), Indium Arsenide (In As), Indium Antimonide (InSb), Indium Phosphide (InP), Lead Telluride (PbTe), Lead Selenide (PbSe), SnSe and their alloys.

11. A method for providing a first semiconductor structure for use in thermoelectric applications, the method comprising the unordered steps of:
  (a) providing a first region of a first semiconductor material, the first region having a first size and the first semiconductor material being doped to a first carrier concentration with a first dopant;
  (b) providing a second region of a second semiconductor material, the second region having a second size and the second semiconductor material being doped to a second carrier concentration with a second dopant such that the first region and second region are both n-type regions or the first and second regions are both p-type regions and the first carrier concentration in the first region is between 5.4 and 22.4 times smaller than the second carrier concentration in the second region;
  (c) arranging the first and second regions to be adjacent to each other so as to define a first interface therebetween; and
  (d) selecting the first material, second material, first carrier concentration, second carrier concentration, first size, second size and first dopant such that a forward electrical potential step is created at the first interface, wherein the forward potential step is defined such that a conduction band edge in the first region, at the first interface, is higher than a conduction band edge in the second region.

12. The method of claim 11 further comprising the unordered step of
  (e) selecting at least one of the first material, second material, first carrier concentration, second carrier concentration, first size, second size, first dopant and second dopant such that the barrier height of the forward electrical potential step has a range of approximately 3-10 $\kappa_B T$, where $\kappa_B$ is the Boltzmann constant and T is the average temperature of the first semiconductor structure.

13. The method of claim 11, further comprising the unordered step of:
  (e) constructing and arranging the first and second regions such that the second region is doped more heavily than the first region.

14. The method of claim 11, wherein the first and second materials are associated with respective first and second resistances and further comprising the unordered step of:
  (e) selecting at least one of the first material, second material, first carrier concentration, second carrier concentration, first size, second size, first dopant and second dopant such that the second electrical resistance is greater than the first electrical resistance.

15. The method of claim 11, wherein the second region further comprises a first side and a second side and the first region comprises a first side and a second side, wherein the first side of the second region is the side adjacent to the first interface and the second side of the first region is the side adjacent to the first interface, and wherein step (c) further comprises growing the first region on a first side of the second region such that the second side of the first region is adjacent to the first side of the second region.

16. The method of claim 15, wherein step (c) further comprises growing the second region on a first side of a substrate having first and second sides, wherein the second side of the second region is disposed adjacent the first side of the substrate and the first side of the second region is disposed adjacent the first region.

17. The method of claim 15, further comprising the unordered steps:
  (e) coupling a first electrode to the first side of the first region; and
  (f) coupling a second electrode to the second side of the second region.

18. The method of claim 11, wherein the second region further comprises a first side and a second side and wherein step (a) further comprises reducing the second carrier concentration in at least a portion of the second region near the second side of the second region, so as to form on the second region a first region that has a lower carrier concentration than that of the second region.

19. The method of claim 11, wherein the first semiconductor structure is constructed to have a first side disposed adjacent to the first region and a second side disposed adjacent to the second region and further comprising the unordered steps of:
  (e) repeating steps (a) through (d) to form a second semiconductor structure, the second semiconductor structure having a respective first side disposed adjacent to its first region and respective second side disposed adjacent to its second region;
  (f) coupling together the first and second semiconductor structures, wherein the second side of the first semiconductor structure is coupled to the first side of the second semiconductor structure.

20. The method of claim 19, wherein at least one of the first and second semiconductor structures has at least one of its respective first and second regions optimized to a respective temperature range associated with the respective region.

21. A method of changing the temperature of an object or area, comprising:
  providing a potential amplified nonequilibrium thermal electric device (PANTEC), the PANTEC having first and second sides with a first region disposed adjacent to the first side of the PANTEC and a second region disposed adjacent to the second side of the PANTEC and with both the first and second regions doped such that the first and second regions are both n-type regions or the first and second regions are both p-type regions and the first carrier concentration in the first region is between 5.4 and 22.4 times smaller than the second carrier concentration in the second region;

disposing the first side of the PANTEC substantially adjacent to at least one of a first object or area, the first object or area being an object or area whose temperature is to be changed;

disposing the second side of the PANTEC substantially adjacent to at least one of a second object or area, the second object or area constructed and arranged to receive at least one of heat or cold;

if the first object or area is to be cooled, applying a current such that at least one of electrons and holes leave the first side of the PANTEC; and if the first object or area is to be heated, applying a current such that at least one of electrons and holes flow towards a side of PANTEC where the first object or area is to be heated.

22. The method of claim 21, wherein:

the first region has a first length and comprises a first semiconductor material doped at the first carrier concentration with a first dopant and the second region is disposed adjacent to the first region so as to define a first interface;

wherein the second region has a second length longer than the first length and comprises a second semiconductor material doped at the second carrier concentration with the first dopant and wherein the second carrier concentration is greater than the first carrier concentration; and wherein the first material, second material, first carrier concentration, second carrier concentration, first length, second length and first dopant are selected such that a forward electrical potential step is created at the first interface, the forward potential step having a barrier height dependent at least in part on an average temperature (T) of the semiconductor structure.

23. The method of claim 22, wherein providing a PANTEC comprises providing a stack comprising at least two PANTECs.

24. A method of generating power, comprising:

providing a potential amplified nonequilibrium thermal electric device (PANTEC), the PANTEC having first and second sides, wherein:

the PANTEC comprises a semiconductor structure having a first region disposed adjacent to the first side of the PANTEC and a second region disposed adjacent to the second side of the PANTEC;

the first region has a first length and comprises a first semiconductor material doped at a first carrier concentration with a first dopant and the second region is disposed adjacent to the first region so as to define a first interface;

the second region has a second length which is longer than the first length and comprises a second semiconductor material doped at a second carrier concentration with a second dopant, wherein the first carrier concentration in the first region is between 5.4 and 22.4 times smaller than the second carrier concentration in the second region, wherein both the first and second regions are n-type regions or both the first and second regions are p-type regions; and the first material, second material, first carrier concentration, second carrier concentration, first length, second length, and first dopant are selected such that a forward electrical potential step is created at the first interface, the forward potential step having a barrier height dependent at least in part on an average temperature (T) of the semiconductor structure, wherein the forward potential step is defined such that a conduction band edge in the first region, at the first interface, is higher than a conduction band edge in the second region;

disposing the first side of the PANTEC substantially adjacent to a heat source; and disposing the second side of the PANTEC such that it is in communication with an object or area capable of operating as a heat sink.

25. The method of claim 24, wherein providing a PANTEC further comprises providing a plurality of PANTECs, wherein the PANTECs are operably coupled together such that the PANTECS are connected together electrically in series and thermally in parallel.

26. The method of claim 24, wherein providing a PANTEC further comprises providing a PANTEC which is an n-type semiconductor structure.

27. The method of claim 24, wherein providing a PANTEC further comprises providing a PANTEC which is a p-type semiconductor structure.

28. The semiconductor structure of claim 1, wherein the first region and second region are both p-type regions.

29. The method of claim 22 wherein the first region and second region are both n-type regions.

30. The method of claim 22 wherein the first region and second region are both p-type regions.

31. The method of claim 24 wherein the first region and second region are both p-type regions.

32. The semiconductor structure of claim 1, wherein the first region and second region are both n-type regions.

33. The method of claim 24 wherein the first region and second region are both n-type regions.

34. The method of claim 11, wherein the forward electrical potential step has a width smaller than the electron mean free path across the first interface.

* * * * *